(12) United States Patent
Wang et al.

(10) Patent No.: US 7,265,898 B2
(45) Date of Patent: *Sep. 4, 2007

(54) SEMICONDUCTOR OPTICAL AMPLIFIER USING LASER CAVITY ENERGY TO AMPLIFY SIGNAL AND METHOD OF FABRICATION THEREOF

(75) Inventors: Shih-Yuan Wang, Palo Alto, CA (US); Miao Zhu, San Jose, CA (US); Zuhua Zhu, San Jose, CA (US); Haiqing Wei, Sunnyvale, CA (US); Saif M. Islam, Santa Clara, CA (US)

(73) Assignee: Gazillion Bits, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/024,319

(22) Filed: Dec. 27, 2004

(65) Prior Publication Data

US 2005/0111079 A1    May 26, 2005

Related U.S. Application Data

(63) Continuation of application No. 10/006,435, filed on Dec. 4, 2001, now Pat. No. 6,836,357, which is a continuation-in-part of application No. 09/972,146, filed on Oct. 4, 2001, now Pat. No. 6,597,497.

(51) Int. Cl.
  *H01S 3/00* (2006.01)
(52) U.S. Cl. ...................... 359/344; 359/337
(58) Field of Classification Search ............. 359/344, 359/337
  See application file for complete search history.

(56) References Cited

U.S. PATENT DOCUMENTS 4,712,075 A    12/1987    Snitzer 4,742,307 A    5/1988    Thylén (Continued)

FOREIGN PATENT DOCUMENTS

| EP | 0851548 | 7/1998 |
|---|---|---|
| EP | 0899838 | 3/1999 |
| EP | 1085625 | 3/2001 |
| WO | WO 0128049 | 4/2001 |

OTHER PUBLICATIONS

Agrawal and Dutta, *Semiconductor Lasers*, 2nd ed., Kluwer Academic Publishers (1993) at Chapter 5.

(Continued)

*Primary Examiner*—Mark Hellner
(74) *Attorney, Agent, or Firm*—Cooper & Dunahm LLP

(57) ABSTRACT

A semiconductor optical amplifier (SOA) apparatus and related methods are described. The SOA comprises a signal waveguide for guiding an optical signal along a signal path, and further comprises one or more laser cavities having a gain medium lying outside the signal waveguide, the gain medium being sufficiently close to the signal waveguide such that, when the gain medium is pumped with an excitation current, the optical signal traveling down the signal waveguide is amplified by an evanescent coupling effect with the laser cavity. When the gain medium is sufficiently pumped to cause lasing action in the laser cavity, gain-clamped amplification of the optical signal is achieved. Additional features relating to segmented laser cavities, separate pumping of laser cavity segments, DFB/DBR gratings, current profiling to improve ASE noise performance, coupled-cavity lasers, avoidance of injection locking effects, manipulation of gain curve peaks, integration with a tunable vertical cavity coupler, integration with a photodetector, integration with an RZ signal modulator, and other described features may be used with the evanescent coupling case or with an SOA having a laser cavity gain medium that is coextensive with the gain medium of the signal waveguide.

15 Claims, 28 Drawing Sheets

U.S. PATENT DOCUMENTS

| | | | |
|---|---|---|---|
| 4,751,719 | A | 6/1988 | Mito et al. |
| 4,939,474 | A | 7/1990 | Eisenstein et al. |
| 4,947,401 | A | 8/1990 | Hinata et al. |
| 5,184,247 | A | 2/1993 | Schimpe |
| 5,291,328 | A | 3/1994 | Devlin et al. |
| 5,436,759 | A * | 7/1995 | Dijaili et al. ............... 359/333 |
| 5,604,628 | A | 2/1997 | Parker et al. |
| 5,654,822 | A | 8/1997 | Ducellier et al. |
| 5,673,141 | A | 9/1997 | Gambini |
| 5,793,521 | A | 8/1998 | O'Brien et al. |
| 6,215,585 | B1 | 4/2001 | Yoshimura et al. |
| 6,249,536 | B1 | 6/2001 | Farries et al. |
| 6,538,808 | B1 * | 3/2003 | Tastavridis .................. 359/344 |
| 6,714,344 | B2 * | 3/2004 | Islam et al. .................. 359/344 |
| 6,836,357 | B2 * | 12/2004 | Wang et al. ................. 359/344 |
| 6,891,664 | B2 * | 5/2005 | DiJaili et al. ............... 359/344 |

OTHER PUBLICATIONS

Bachmann, M., Doussiere, P., Emery, J., N'Go, R., Pommereau, F., Goldstein, L., Soulage, G., Jourdan, A., "Polarisation-insensitive clamped-gain SOA with integrated spot-size convertor and DBR gratings for WDM applications at 1.55 im wavelength," Electronics Letters, vol. 32, No. 22 (Oct. 24, 1996).

Bernard, J., and Renaud, M., "Tutorial: Semiconductor Optical Amplifiers," SPIE's OE Magazine, Sep. 2001, pp. 36-38.

Doussiere, P., Jourdan, A., Soulage, G., Garabedian, P., Graver, C., Fillion, T., Derouin, E., Leclerc, D., "Clamped gain traveling wave semiconductor optical amplifier for wavelength division multiplexing applications," Proceedings of IEEE 14th International Semiconductor Laser Conference (Cat. No. 94CH3379-5), Maui, HI, USA, (Sep. 19-23, 1994), pp. 185-186.

Doussiere, P. et. al., "1.55 im Polarisation Independent Semiconductor Optical Amplifier with 25 dB Fiber to Fiber Gain," IEEE Photonics Technology Letters, vol. 6, No. 2, pp. 170-172 (Feb. 1994).

Duchet, C., et. al., "Polarisation insensitive modulator and influence of propagation direction on bulk electroabsorption," Electronics Letters, vol. 33, No. 3, (Jan. 30, 1997).

Francis, et. al., "A Single Chip Linear Optical Amplifier," IEEE Optical Fiber Communication Conference, Anaheim, CA (2001).

Francois et. al., "Horizontal Directional Coupler Filter Suitable for Integration in a 1.3+/1.3- Duplexer," Electronics Letters, vol. 31, No. 23 (Nov. 9, 1995).

Garbuzov, D. et. al., "1.5 micrometers wavelength SCH-MQW InGaAsP/InP broadened waveguide laser diodes with low internal loss and high output power," Electronics Letters, vol. 32, No. 18 (Aug. 29, 1996).

Hofling et. al., "Short-Cavity Edge-Emitting Lasers With Deeply Etched Distributed Bragg Mirrors," Electronics Letters, vol. 35, No. 2 (Jan. 21, 1999).

Hofstetter et al, "Ridge waveguide DBR laser with nonabsorbing grating and transparent integrated waveguide," Electronics Letters, vol. 31, No. 12, 1995, p. 980.

Ido, T. et. al., "Polarization and Wavelength Insensitive MQW Electroabsorption Optical Gates for WDM Switching Systems," IEEE Photonics Technology Letters, vol. 8, No. 6, pp. 788-790 (Jun. 1996).

Ido, T. et. al., "Ultra-High-Speed Multiple-Quantum-Well Electro-Absorption Optical Modulators with Integrated Waveguides," Journal of Lightwave Technology, vol. 14, No. 9, pp. 2026-2034 (Sep. 1996).

Joannopoulos, "Molding the Flow of Light," M.I.T. 2001 Physics Annual (2001) at pp. 32-43.

Kawano et. al., "4×4 InGaAlAs/InAlAs MQW Directional Coupler Waveguide Switch Modules Integrated with Spot-Size Converters and Their 10 Gb/s Operation," Electronics Letters, vol. 31, No. 2 (Jan. 19, 1995).

Kohtuku, M., et. al., InP based 64 channel arrayed waveguide grating with 50 GHz channel spacing and up to—20dB crosstalk, Electronics Letters, vol. 33, No. 21, (Oct. 9, 1997).

Lam et. al., "Plasma immersion Ar+ ion implantation induced disorder in strained InGaAsP multiple quantum well," Electronics Letters, vol. 34, No. 8, (Apr. 16, 1998).

Liu et.al., "Optical Add/Drop Multiplexers Based on X-Crossing Vertical Coupler Filters," IEEE Photonics Technology Letters, vol. 12, No. 4 (Apr. 2000).

Liu, B., et. al., "Fused InP-GaAs vertical coupler filters," IEEE Photonics Technology Letters, vol. 11, No. 1, (Jan. 1999), pp. 93-95.

Loncar et. al., "Waveguiding in Planar Photonic Crystals," Applied Physics Letters vol. 77, No. 13 (Sep. 25, 2000) at pp. 1937-1939.

Lullo et. al., "Fabrication of electroabsorption optical modulators using laser disordered GaInAs/GaInAsP multiquantum well structures," Electronics Letters, vol. 30, No. 19, 1994, p. 1623.

Matsumoto, S. et. al., "Highly reliable 1.55 micrometers GaInAsP laser diodes buried with semi-insulating iron-doped InP," Electronics Letters, vol. 30, No. 16 (Aug. 4, 1994), pp. 1305-1306.

Morl, L., et. al., "Uncladded InGaAsP/InP rib waveguides with integrated thickness tapers for efficient fibre-chip butt coupling," Electronics Letters, vol. 32, No. 1 (Jan. 4, 1996), pp. 36-38.

Nakamura, T. et al., "High efficiency 0.5W/A at 85 degrees C strained multiquantum well lasers entirely grown by MOVPE on p-InP substrate", Electronics Letters, vol. 34, No. 6 (Mar. 19, 1998).

Ortsiefer, M. et. al., "Room temperature operation of index guided 1.55 micrometers InP based vertical cavity surface emitting laser," Electronics Letters, vol. 36, No. 5 (Mar. 2, 2000).

Ougazzaden, A. et. al., "40 Gb/s Tandem Electro-Absorption Modulator," Optical Fiber Communication Conference and Exhibit, pp. PD14-1 to PD14-3, Optical Society of America, Anaheim, California (Mar. 17-22, 2001).

Samsung Electronics, *GA40B3A 1550 nm Gain Clamped Semiconductor Optical Amplifier Module: Technical Data Sheet*, 10-page technical data sheet from Samsung Electronics Optoelectronics Division (Aug. 2001), available on or before Dec. 3, 2001 at http://samsungelectronics.com/fiberoptics/downloads/ga40b3a.pdf.

Shibata et. al., "Semiconductor Monolithic Wavelength Selective Router Using Grating Switch with Directional Coupler," Electronics Letters, vol. 31, No. 12 (Jun. 8, 1995).

Verbeek, Bart H., "Semiconductor Optical Amplifiers: Basics and Applications," 64-page Booklet handed out at the International Semiconductor Laser Conference 2000, Short Course 3, Monterey, California (IEEE, Sep. 24-28, 2000).

Wiedmann et. al., "Singlemode Operation Of Deeply Etched Coupled Cavity Laser With DBR Facet," Electronics Letters, vol. 36, No. 14 (Jul. 6, 2000).

Zhang, B. et. al., "High speed InGaAsP/InP selective proton bombarded buried cresent lasers with optical field attenuation regions," Electronics Letters, vol. 34, No.1 (Jan. 8, 1998).

Oct. 1, 2001, Previous News Analysis, "Kamelian to Upstage Genoa"? Amsterdam—ECOC 2001 [European Conference on Optical Communication which takes place in Amsterdam from Sep. 30 to Oct. 4, 2001].

* cited by examiner

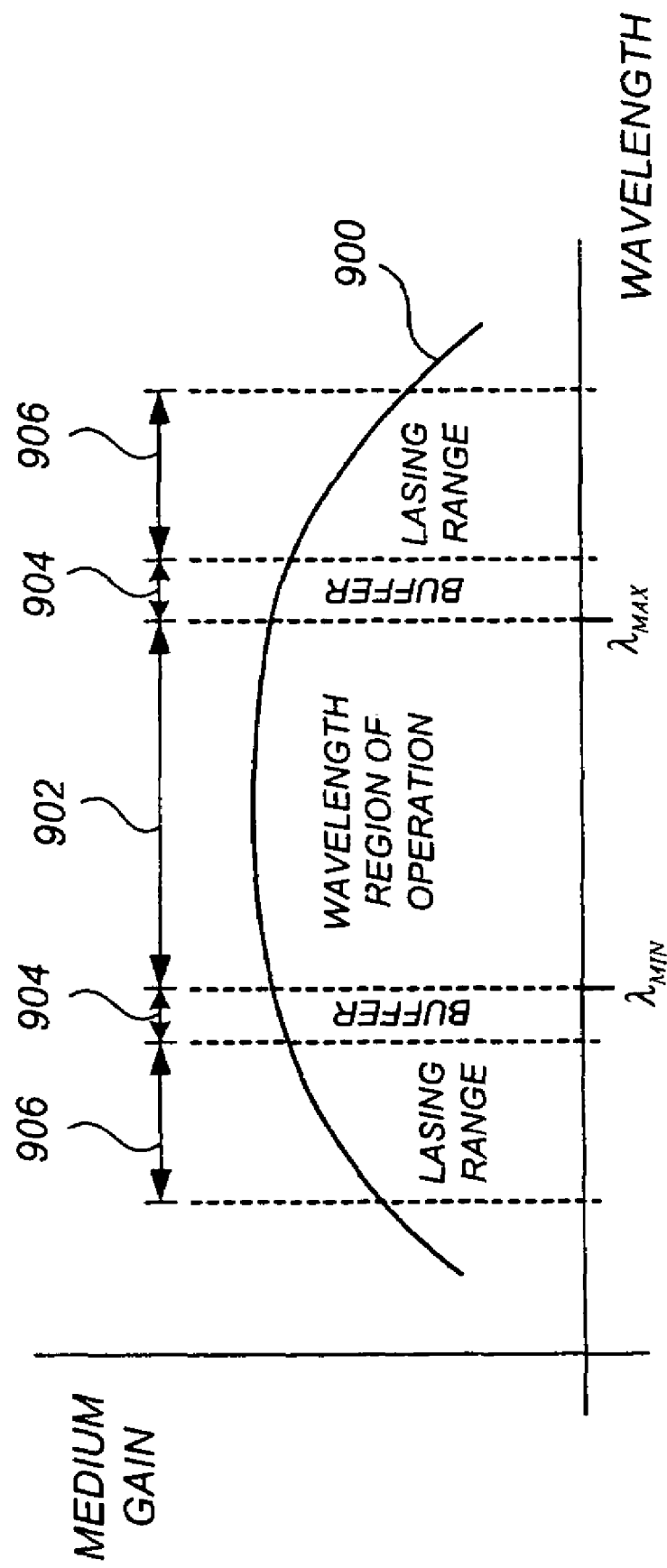

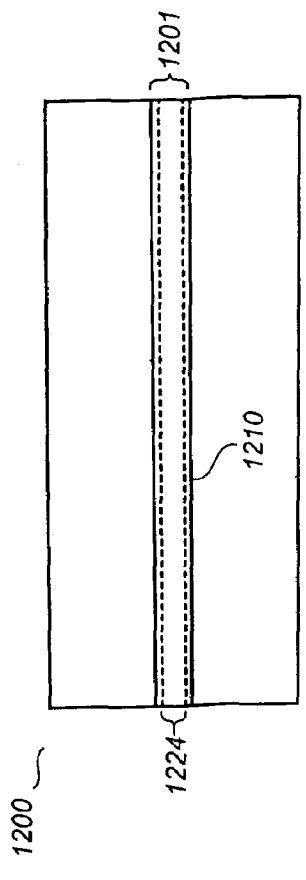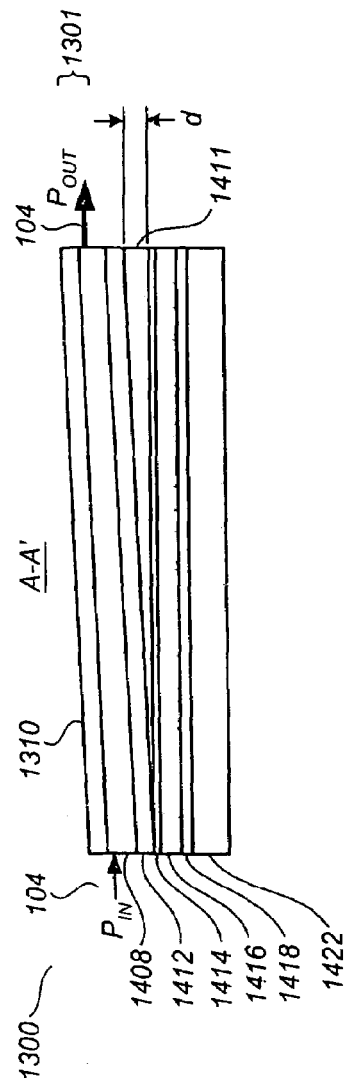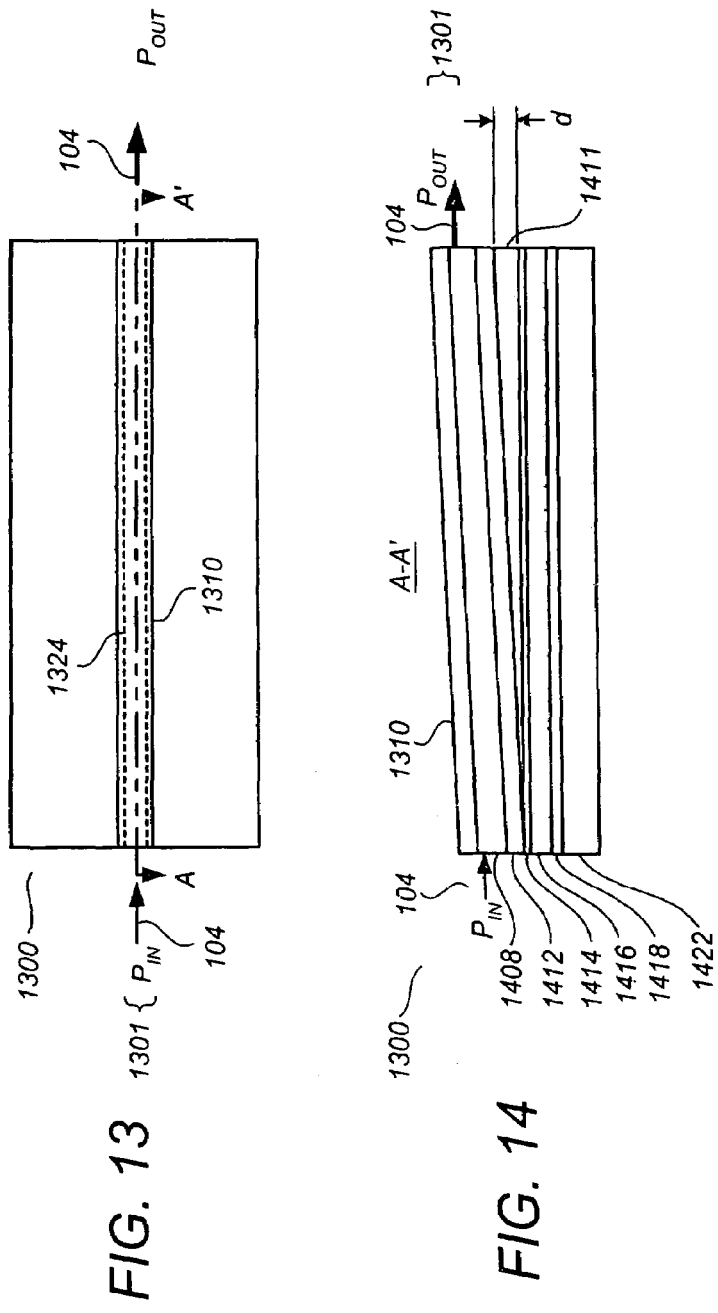
FIG. 12
FIG. 13
FIG. 14

SEMICONDUCTOR OPTICAL AMPLIFIER USING LASER CAVITY ENERGY TO AMPLIFY SIGNAL AND METHOD OF FABRICATION THEREOF

CROSS-REFERENCE TO RELATED APPLICATIONS

This application is a Rule 1.53(b) continuation of U.S. Ser. No. 10/006,435, filed Dec. 4, 2001 now U.S. Pat. No. 6,836,357, which is a continuation-in-part of U.S. Ser. No. 09/972,146, filed Oct. 4, 2001, now U.S. Pat. No. 6,597,497, issued Jul. 22, 2003. The entire contents of applications Ser. Nos. 10/006,435 and 09/972,146 are incorporated by reference herein.

FIELD

This patent specification relates to optical amplifiers. More specifically, it relates to a semiconductor optical amplifier that amplifies an optical signal using energy from one or more nearby and/or intersecting laser cavities.

BACKGROUND

As the world's need for communication capacity continues to increase, the use of optical signals to transfer large amounts of information has become increasingly favored over other schemes such as those using twisted copper wires, coaxial cables, or microwave links. Optical communication systems use optical signals to carry information at high speeds over an optical path such as an optical fiber. Optical fiber communication systems are generally immune to electromagnetic interference effects, unlike the other schemes listed above. Furthermore, the silica glass fibers used in fiber optic communication systems are lightweight, comparatively low cost, and are capable of very high-bandwidth operation.

Optical amplifiers are important components of optical communications links. Optical amplifiers are commonly used as (i) power amplifiers at the source end of an optical communications link, (ii) line amplifiers along the optical signal transmission path, and (iii) preamplifiers at the receiving end of the optical communications link, and have other uses as well.

In general, the two primary types of optical amplifiers are optical fiber based amplifiers, such as erbium doped fiber amplifiers (EDFAs) and Raman amplifiers, and semiconductor optical amplifiers (SOAs). EDFAs are widely used in line amplifiers and other applications requiring high output power, high data rates, and low noise. However, EDFAs are quite bulky, having a typical fiber length of about 30 feet, and require the presence of a separate pumping laser to operate. Accordingly, EDFAs are difficult to incorporate into confined spaces, and are certainly not amenable to circuit-board-level or chip-level integration.

SOAs, on the other hand, are small in size and conveniently integrated into small devices. An SOA generally resembles a semiconductor laser structure, except that the end mirrors are replaced by antireflection coatings. In such devices the product of the gain and the reflectivity is less than one so that the device does not oscillate. Rather, the device is used to amplify an incoming optical signal as it passes through the device. Such devices are often called traveling wave amplifiers, which highlights the fact that the optical signal does not pass back and forth within the device, but merely passes through it essentially only once. SOAs generally yield lower output power and higher noise levels as compared to EDFAs, and/or are restricted to lower data rates at high output power due to pattern dependent amplitude variations. Research continues toward improving the performance of SOAs, including making SOAs with higher power and lower noise characteristics, and/or that are capable of operating at higher data rates at high input power without suffering significant pattern dependent amplitude fluctuations.

Crosstalk is one of the primary troublesome noise sources in conventional SOAs. Crosstalk, or cross-channel modulation, involves data-dependent gain fluctuations at high output levels from the SOA, and can occur for either time-multiplexed or wavelength-multiplexed data. Crosstalk arises from gain saturation effects in an SOA. These effects can be understood by recalling that SOA devices rely on the phenomenon of stimulated emission to provide the necessary amplification. Stimulated emission, in turn, requires the establishment of a population inversion. In typical SOAs or lasers a population inversion is evidenced by the presence of a specified carrier density. When a sufficiently large optical signal is passed through the amplifier, the population inversion is substantially reduced or depleted, i.e. the gain of the SOA is saturated, and is reestablished only over some finite period of time. Consequently, the gain of the SOA will be reduced for some period of time following the passage of the signal through the amplifier, a time period commonly denoted as the amplifier gain recovery time.

When the gain medium becomes saturated due to a high signal level on a first channel, changes are induced in the signal level of a second channel because the saturated gain medium cannot properly amplify both channels. Since gain is modulated by the first signal, this modulated gain is impressed on the second signal. Thus, for wavelength division multiplexed (WDM) systems in which a plurality of channels at $\lambda_1, \lambda_2, \ldots, \lambda_N$ are present in a common optical signal, gain saturation induced by a first channel at $\lambda_1$ can produce unwanted level changes (i.e., errors) in a second data channel at $\lambda_2$, and vice versa.

Crosstalk can be reduced by keeping the SOA out of gain saturation for the data rates, signal levels, and number of channels on the optical signal of interest. If the SOA is operated near gain saturation levels, crosstalk may be reduced by making the "off" portion of the signal duty cycle longer in comparison to the gain recovery time, i.e., by slowing down the data rate. In general, an SOA will have reduced crosstalk effects if (i) its saturation power $P_{SAT}$, i.e., the input optical power level for which the SOA gain is reduced to a predetermined percentage of its nominal value, is increased, and/or (ii) its gain recovery time is decreased. As used herein, an SOA has increased gain stability if (i) its saturation power $P_{SAT}$ is increased without a concomitant increase in gain recovery time, (ii) its gain recovery time is decreased without a concomitant decrease in saturation power $P_{SAT}$, or (iii) both (i) and (ii) occur.

Several methods for dealing with crosstalk problems are discussed in U.S. Pat. No. 5,436,759, which is incorporated by reference herein. One particularly appealing strategy is to place a transverse laser across the SOA such that the laser's gain medium and the SOA's signal gain medium share an overlapping region. The lasing cavity is operated above threshold and the gain of the laser is clamped to overcome the losses of the cavity. As used herein, a laser cavity is gain-clamped and lasing when it is excited by a bias current greater than a threshold current. When the transverse laser is gain-clamped, gain along the SOA signal path is stabilized. The transverse lasing enhances the establishment and maintenance of a population inversion in the overlapping region, resulting in both increased saturation power and a decreased gain recovery time due to increased photon density in the laser cavity. Advantageously, independent lasing only builds up in the transverse direction and does not corrupt the quality of the amplified signal. Other methods in which the gain media of SOAs is coextensive with the gain media of transverse lasers are discussed in Francis, et. al., "A Single Chip Linear Optical Amplifier," IEEE Optical Fiber Communication Conference, Anaheim, Calif. (2001), which is incorporated by reference herein, and in U.S. Ser. No. 09/972,146, supra.

Amplified spontaneous emission (ASE) is another primary troublesome noise source in conventional SOAs. ASE arises from random, spontaneous energy state drops in a small fraction of the excited carriers of the gain medium. Light emitted as a result of these energy state drops is generally random in direction and wavelength. Some of this light will be emitted in the direction of signal propagation and will therefore be amplified as it propagates, resulting in output background noise signal similar to white noise. For good performance, it is generally desirable to keep the amplified signal levels at least 10 dB higher than ASE levels.

One potential disadvantage of an SOA having a gain medium coextensive with the gain medium of a transverse laser cavity is that ASE levels in the output can be relatively high. This is because the population inversion of the gain medium, and therefore the number of carriers experiencing spontaneous energy state drops, is maintained at high levels by the transverse lasing field. Other potential drawbacks, include polarization sensitivity, output power limitations, and reduced coupling efficiency are related to the generally thin nature of the gain medium layer itself in such devices. Whereas the width of the signal path is usually on the order of 8 μm for single-mode propagation, the height of the signal path is generally limited to the thickness of the gain medium layer, which is often less than 1 μm. Thus, the signal waveguide has a small cross-section (as compared to single-mode waveguides having larger aspect ratios), which limits overall power carrying capacity and reduces coupling efficiency with external planar lightwave circuits and optical fibers. Moreover, the small height dimension causes the signal waveguide to prefer one light polarization over another, causing the SOA to be polarization sensitive and difficult to couple to optical fibers.

The proposed designs discussed in U.S. Pat. No. 5,436,759, supra, also suffer from other shortcomings that can reduce the effectiveness or usefulness of the SOA device and/or cause difficulty in reliably fabricating the device. For example, while the electrical pumping current applied to the laser cavity dictates the presence of gain-clamped operation (below-threshold current yields unclamped operation, above-threshold yields clamped operation), there are no controls provided that allow for dynamic control of the actual amount of gain once the gain is clamped. As another example, the layers of the single active medium ('759 patent, FIG. 1) can be difficult to construct reliably with consistent thickness across the entire lateral area to be covered. In addition, the semiconductor layers may contain local defects such as crystal dislocations, pitting, voids, etc. Such defects in the epitaxial growth can be a point of lower electrical resistance than the surrounding epitaxial areas. The higher electrical current flowing through these points of lower electrical resistance can create "hot spots" which cause non-uniform gain in the effected areas. In addition to the less than optimal performance resulting form the non-uniform gain, the "hot spots" can be a source of excessive current drain and premature device failure. As another example, undesired parasitic modes or uneven lasing may arise due to lack of electrical isolation among laser cavity segments at intersections with the signal gain medium.

The approach discussed in Francis, supra, in which the signal waveguide and a vertical cavity surface emitting laser (VCSEL) share the same active region, can also suffer from non-uniform current flows and hot spots due to defects in crystal growth and non-uniform epitaxial layers. Moreover, such devices can have limited output power due to the small gain medium volume of VCSELs, as well as for other reasons.

U.S. Pat. No. 5,291,328, which is incorporated by reference herein, discusses a semiconductor optical amplifier having an active layer vertically separated from a signal waveguiding layer in order to reduce polarization sensitivity. The active layer and passive waveguide layer are vertically collinear between the input and output facets of the device. According to the discussion of the '328 patent, by using a structure which is analogous to a buried-heterostructure distributed feedback laser having a waveguiding layer and an active layer in close association, but without the grating, it is possible to achieve high gain and low polarization sensitivity over a usefully broad wavelength range. However, the device discussed in the '328 patent is not designed for lasing action to occur in the active layer, having antireflective coatings at the end facets, and would accordingly suffer from the crosstalk problems discussed supra. Moreover, the device can also suffer from non-uniform current flows and hot spots due to defects in crystal growth and non-uniform epitaxial layers, although such problems are less relevant because the device does not achieve lasing action anyway.

U.S. Pat. No. 4,742,307, which is incorporated by reference herein, also discusses a semiconductor optical amplifier having an active layer vertically separated from a passive waveguide layer, for the discussed purpose of reducing ASE noise in the output. The active layer and passive waveguide layers are vertically collinear between the input and output facets of the device. Notably, the device of the '307 discussion has increased separation between the active layer and the passive waveguide layer near the ends of the device for easier coupling between external fibers and the signal path ('307 patent, FIGS. 1A, 1B, 7). However, this separation is in the vertical direction, and must therefore be achieved by differential growth processes or other more complicated fabrication steps. This is particularly troublesome where appreciable separations approaching 8 μm or more are needed for efficient coupling into fibers. Moreover, as with the device of the '328 patent, the device of the '307 patent is not designed for lasing action to occur in the active layer, and would accordingly suffer from the crosstalk problems discussed supra. The device can also suffer from non-uniform current flows and hot spots due to defects in crystal growth and non-uniform epitaxial layers although, as with the '328 device, these problems are less relevant because the device does not achieve lasing action anyway.

Accordingly, it would be desirable to provide a semiconductor optical amplifier (SOA) having reduced crosstalk effects while also having reduced polarization sensitivity.

It would be further desirable to provide an SOA having reduced crosstalk effects while also having reduced amplified spontaneous emission (ASE) noise levels.

It would be even further desirable to provide an SOA having reduced crosstalk effects while also allowing dynamic adjustment of gain during gain-clamped operation.

It would be still further desirable to provide such an SOA capable of achieving a variable gain characteristic along its length.

It would be even further desirable to provide such an SOA in which signal power capacity is increased and coupling efficiency with optical fibers and planar lightwave circuits is increased.

It would be even further desirable to provide such an SOA that can be reliably fabricated.

It would be still further desirable to provide such an SOA that is more operationally robust against the presence of local defects that may occur during device fabrication.

SUMMARY

According to a preferred embodiment, a semiconductor optical amplifier (SOA) apparatus and related methods are provided for amplifying an optical signal, the SOA comprising a signal waveguide for guiding the optical signal along a signal path, the SOA further comprising one or more laser cavities having a gain medium lying outside the signal waveguide. Although lying outside the signal waveguide, the gain medium of the laser cavity is sufficiently close to the signal waveguide such that, when the gain medium is pumped with an excitation current, the optical signal traveling down the signal waveguide is amplified by an evanescent coupling effect with the laser cavity. When the gain medium is sufficiently pumped to cause lasing action in the laser cavity, gain-clamped amplification of the optical signal is achieved. An SOA according to the preferred embodiments provides for sufficient signal amplification while also providing a more symmetric waveguide for the optical signal to follow, thereby reducing polarization sensitivity, increasing signal power capacity levels, and increasing coupling efficiency with planar lightwave circuits and optical fibers. Because the ASE generated by the gain medium layer does not couple well into the signal waveguide, output ASE levels are reduced.

In one preferred embodiment, one or more laser cavities is provided, each laser cavity comprising a main segment that evanescently couples with the optical signal, each laser cavity further comprising an auxiliary segment that is electrically isolated from the main segment, the main segment and the auxiliary segment being provided with separate electrical excitation currents. The laser cavities are also electrically isolated from one another. The electrical excitation currents provided to the various laser cavities and cavity segments are varied so as to achieve improved performance with respect to one or more operating characteristics, and/or to achieve desired signal processing objectives. In another preferred embodiment comprising a plurality of laser cavities adjacently positioned between the optical signal input and the optical signal output, amplified spontaneous emission (ASE) noise performance is improved by tailoring the amount of current supplied to the auxiliary segments of successive laser cavities. In other preferred embodiments, an array of two or more signal waveguides share a common set of transverse laser cavities.

In one preferred embodiment, extraneous output energy lying within the wavelengths of operation of the SOA is avoided by including distributed Bragg reflector (DBR) gratings and/or distributed feedback (DFB) gratings in one or more of the laser cavities. In another preferred embodiment, the period of the DBR and/or DFB gratings is varied among successive laser cavities so that their respective lasing wavelengths differ, thereby avoiding undesired coupling effects and/or injection locking effects. In another preferred embodiment, coupled-cavity lasers are used for enhancing single-frequency operation with greater side mode suppression. In another preferred embodiment, gain curve peaks of the active medium within a given laser cavity are separately manipulated with differing currents/junction temperatures to increase device efficiency. In other preferred embodiments, novel integrations are provided that include an SOA having signal amplification energy provided by a nearby laser cavity, in which the SOA is integrated onto a common substrate with a tunable vertical cavity coupler, a photodetector, and a return-to-zero signal modulator, respectively.

In other preferred embodiments, one or more of the above features relating to using DFB/DBR gratings, varying cavity segment currents, improving ASE noise performance, using coupled-cavity lasers, avoiding injection locking effects, manipulating gain curve peaks, integration with a tunable vertical cavity coupler, integration with a photodetector, integration with an RZ signal modulator, arraying of the signal waveguides, and other features described herein are used in conjunction with an SOA having a laser cavity gain medium that is coextensive with the gain medium of the signal waveguide.

BRIEF DESCRIPTION OF THE DRAWINGS

FIG. 9 illustrates a plot of laser gain medium gain versus wavelength and associated operational wavelengths of the SOA of FIG. 6;

FIG. 12 illustrates a top-view of an SOA in accordance with a preferred embodiment;

FIG. 13 illustrates a top view of an SOA in accordance with a preferred embodiment;

FIG. 14 illustrates a cross-sectional view of the SOA of FIG. 13;

DESCRIPTION

Figure 1:
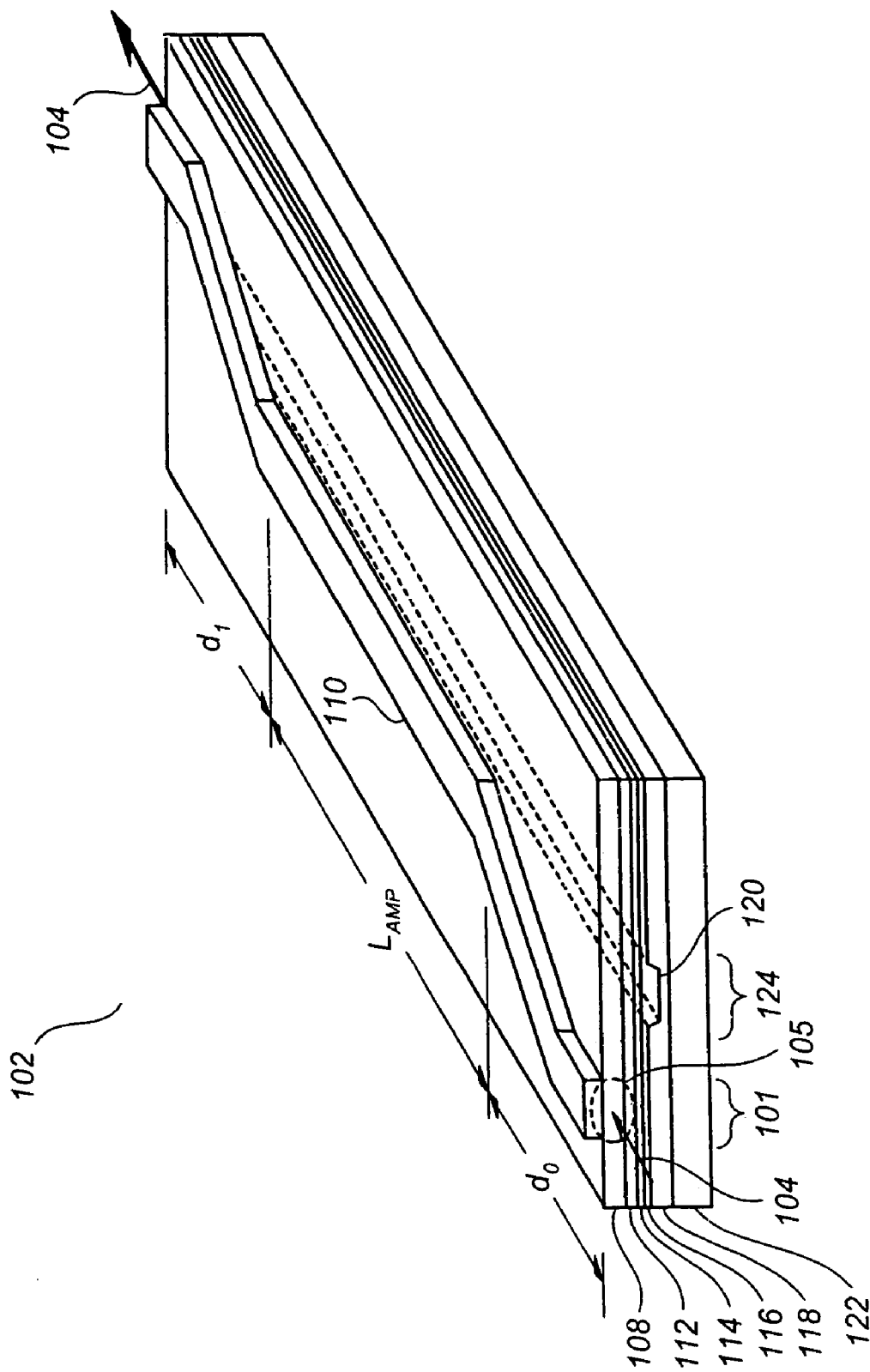
FIG. 1 illustrates a perspective view of a semiconductor optical amplifier (SOA) in accordance with a preferred embodiment.

FIG. 1 illustrates a simplified perspective view of a semiconductor optical amplifier (SOA) 102 in accordance with a preferred embodiment. SOA 102 receives an optical signal 104 at an input, guides the optical signal 104 along an optical path 105 while also amplifying it, and provides an amplified version of the optical signal 104 at an output as indicated in FIG. 1. SOA 102 comprises a signal guiding layer 108, a ridge element 110, and a first cladding layer 112 positioned as shown in FIG. 1, the guiding layer 108 having a refractive index that is higher than the refractive indices of the ridge element 110 and the first cladding layer 112 such that the optical signal 104 is vertically confined. By way of example, the guiding layer 108 comprises passive waveguiding p-doped indium gallium arsenide phosphide, e.g., $In_{0.95}Ga_{0.05}As_{0.1}P_{0.9}$, while the ridge element 110 and first cladding layer 112 comprise p-doped indium phosphide (p-InP). It is to be appreciated, however, that other material systems having the appropriate characteristics may be used. Ridge element 110 also provides for horizontal confinement of the optical signal 104, such that the optical path 105 generally follows underneath the ridge element 110 between the input and the output of the SOA 102. Collectively, the guiding layer 108, the ridge element 110, and the first cladding layer 112 form a signal waveguide 101 defining the optical path 105 as indicated in FIG. 1. In other preferred embodiments, the signal waveguide 101 is similar to any of a variety of ridge waveguide structures such as those described in Agrawal and Dutta, *Semiconductor Lasers*, $2^{nd}$ ed., Kluwer Academic Publishers (1993) at Chapter 5, which is incorporated by reference herein.

SOA 102 further comprises a gain medium layer 114, a laser waveguiding layer 116, and a second cladding layer 118 positioned as shown in FIG. 1. Gain medium layer 114 may interchangeably be called an active layer herein. The laser waveguiding layer 116 and second cladding layer 118 are shaped to form a rib element 120 longitudinally extending from one end of the device to the other. Gain medium layer 114 has a refractive index greater than the refractive index of the first cladding layer 112 and similar to the refractive index of the laser waveguiding layer 116, which in turn has a refractive index greater than the refractive index of the second cladding layer 118. By way of example, the gain medium layer 114 comprises bulk active indium gallium arsenide phosphide, e.g., $In_{0.7}Ga_{0.3}As_{0.7}P_{0.3}$, or may comprise multiple quantum wells (MQWs) according to a InGaAsP/InGaAs/InP material system. The laser waveguiding layer 116 comprises passive waveguiding n-doped indium gallium arsenide phosphide, e.g., $In_{0.95}Ga_{0.05}As_{0.1}P_{0.9}$, and the second cladding layer 118 comprises n-doped indium phosphide (n-InP), these layers being formed on top of an indium phosphide (InP) substrate 122. Again, however, other material systems having the appropriate characteristics may be used.

It is to be appreciated that while the SOA 102 comprises a p-over-n buried heterostructure laser in which a signal waveguide is placed above the gain medium layer on the "p" side, a complementary structure in which the signal waveguide is placed on the "n" side of the gain medium is of course within the scope of the preferred embodiments. Indeed, the complementary implementation could be advantageous in that n-doped signal waveguides typically have lower optical absorption losses than p-doped signal waveguides. For simplicity and clarity of disclosure, however, the preferred embodiments are described herein as having a signal waveguide on the "p" side of the gain medium layer.

A lower electrical contact (not shown) is provided on a bottom side of substrate 122, comprising for example sputtered Ti/Pt/Au. An upper electrical contact (not shown) is provided along the surface of the SOA 102, comprising for example Ti/Au, such that an electrical current flowing between the upper and lower electrical contacts passes through the gain medium layer 114 near the rib element 120. Accordingly, an index-guided edge emitting laser cavity 124 is formed (i) longitudinally between the front and rear end mirrors, (ii) vertically between the first and second cladding layers 112 and 118, with (iii) lateral confinement being provided by the presence of the rib element 120. When the electrical current through the gain medium 114 inside the laser cavity 124 exceeds a threshold current, lasing action occurs. In other preferred embodiments, the laser cavity 124 is similar to any of a variety of rib waveguide structures such as those described in Agrawal, supra at Chapter 5.

If necessary for proper lasing operation, partially reflective end mirrors (not shown) are provided at each longitudinal end of the SOA 102 at the rib element 120. If the facets at each longitudinal end of the SOA 102 are cleaved (as opposed to being dry-etched), there may be sufficient reflectivity to obviate the need for the end mirrors. Generally speaking, it is desirable to have end facet reflectivities around the rib element 120 that are not less than 10 percent, and preferably 30 percent or greater, so that lasing action is facilitated in the laser cavity 124. Antireflective coatings (not shown) are provided at each longitudinal end of the SOA 102 at the entry and exit points of the signal waveguide 101.

As indicated in FIG. 1, for a first longitudinal interval of length $d_0$ the signal waveguide 101 does not lie directly above the laser cavity 124 and the optical signal is not amplified. This is also the case for a final longitudinal interval of length $d_1$. It is preferable to keep the distances $d_0$ and $d_1$ short in order to minimize loss in those intervals and to keep overall device dimensions small. However, to facilitate coupling to external optical devices, there must be sufficient lateral separation between the facets of the laser cavity 124 and the input and output of the signal waveguide 101, e.g., about 10 µm or more. This, in turn, requires sufficiently large distances $d_0$ and $d_1$ such that large-angles in the optical signal path are not encountered. By way of example and not by way of limitation, signal losses are tolerable if the signal path angles are kept below about 1 degree, which in turn requires distances $d_0$ and $d_1$ to be on the order of about 1 mm. In other preferred embodiments, less desirable but still tolerable signal losses are incurred if the signal path angles are kept below about 10 degrees, which in turn requires distances $d_0$ and $d_1$ to be on the order of about 100 µm. In still other preferred embodiments, the distances $d_0$ and $d_1$ can be drastically reduced by using certain photonic crystal planar circuits that have been shown to guide light at 1550 nm around sharp corners having radii of curvature similar to the wavelength of the light, as described in Loncar et. al., "Waveguiding in Planar Photonic Crystals," Applied Physics Letters Vol. 77, No. 13 (Sep. 25, 2000) at pp. 1937-1939, and in Joannopoulos, "Molding the Flow of Light," M.I.T. 2001 Physics Annual (2001) at pp. 32-43, each of which is incorporated by reference herein.

For a second longitudinal interval of length $L_{AMP}$, the signal waveguide 101 vertically coincides with the laser cavity 124 to form an evanescent coupling region. When the laser cavity 124 is lasing, or when the laser cavity 124 is not lasing but a sufficient population inversion exists due to an electrical excitation current, the optical signal 104 is amplified by an evanescent coupling effect with the laser cavity 124 in the evanescent coupling region. The particular lateral dimensions and layer thicknesses required to facilitate such evanescent coupling between the signal waveguide 101 and the laser cavity 124 depends on factors such as the particular material compositions, refractive indices, doping levels, signal powers, wavelength ranges used, and other factors. In light of the present disclosure, however, one skilled in the art would be readily able to determine a suitable set of parameters and implement an SOA in accordance with the preferred embodiments.

By way of example and not by way of limitation, for propagation and amplification of a single-mode WDM signal near the 1550 nm range for a device based on an InP/InGaAsP material system, in one preferred embodiment the width of the ridge element 110 is approximately 8-10 µm, the thickness of the guiding layer 108 is about 3 µm, the thickness of the first cladding layer 112 is in the range of about 0.5-2.0 µm, and the thickness of the gain medium layer 114 is about 0.2 µm. The thickness of the laser waveguiding layer 116 is about 0.2 µm in the non-rib areas and about 0.4 µm in the area of the rib element 120, which has a lateral width of approximately 8-10 µm. The amplification distance $L_{AMP}$ may be in the range of 0.2 mm-2 mm, although this may be varied significantly depending on the required overall amplification and the signal gain per unit length.

In another preferred embodiment, the thickness of the guiding layer 108 is 0.4 µm, the thickness of the first cladding layer 112 is about 1 µm, and the thickness of the gain medium layer 114 is about 0.2 µm. In yet another preferred embodiment, the thickness of the guiding layer 108 is about 0.23 µm, the thickness of the first cladding layer 112 is about 0.16 µm, and the thickness of the gain medium layer is about 0.18 µm. It is to be appreciated, however, that while the above dimensions are examples of suitable ones, one skilled in the art could readily determine a variety of different operable ranges and parameter combinations for an SOA in accordance with the preferred embodiments in light of the present disclosure.

Some operating ranges for the SOA 102 are presented here by way of example and not by way of limitation. A typical input signal power is in range of 10-100 µW, a typical lasing power for the laser cavity 124 is in the range of 5-50 mW, a typical signal gain is in the range of 20-30 dB, and a typical output signal power is in the range of 1-100 mW. It is to be appreciated, however, that one skilled in the art could readily adapt the SOA 102 for use in substantially higher or lower optical power environments in light of the present disclosure, with resulting devices being capable of widely differing input signal power levels, lasing power levels, signal gain levels, and/or output power levels, without departing from the scope of the preferred embodiments.

The SOA 102 in accordance with the preferred embodiments provides for sufficient signal amplification while also providing a more symmetric waveguide for the optical signal to follow, thereby reducing polarization sensitivity, increasing signal power capacity levels, and increasing signal coupling efficiencies as compared to devices requiring the optical signal to propagate along the gain medium layer itself. Also, because the ASE generated by the gain medium layer does not couple well into the signal waveguide, output ASE levels are reduced.

The laser cavity 124, as well as the laser cavities infra that provide the amplification energy for an optical signal propagating down a nearby (or intersecting) signal waveguide, can generally be referred to as excitation lasers or ballast lasers due to their role in the SOA device. The light emitted from the laser itself is not used. Rather, the laser is used as an energy source for amplifying an optical signal different than the laser's own beam.

Figure 2:
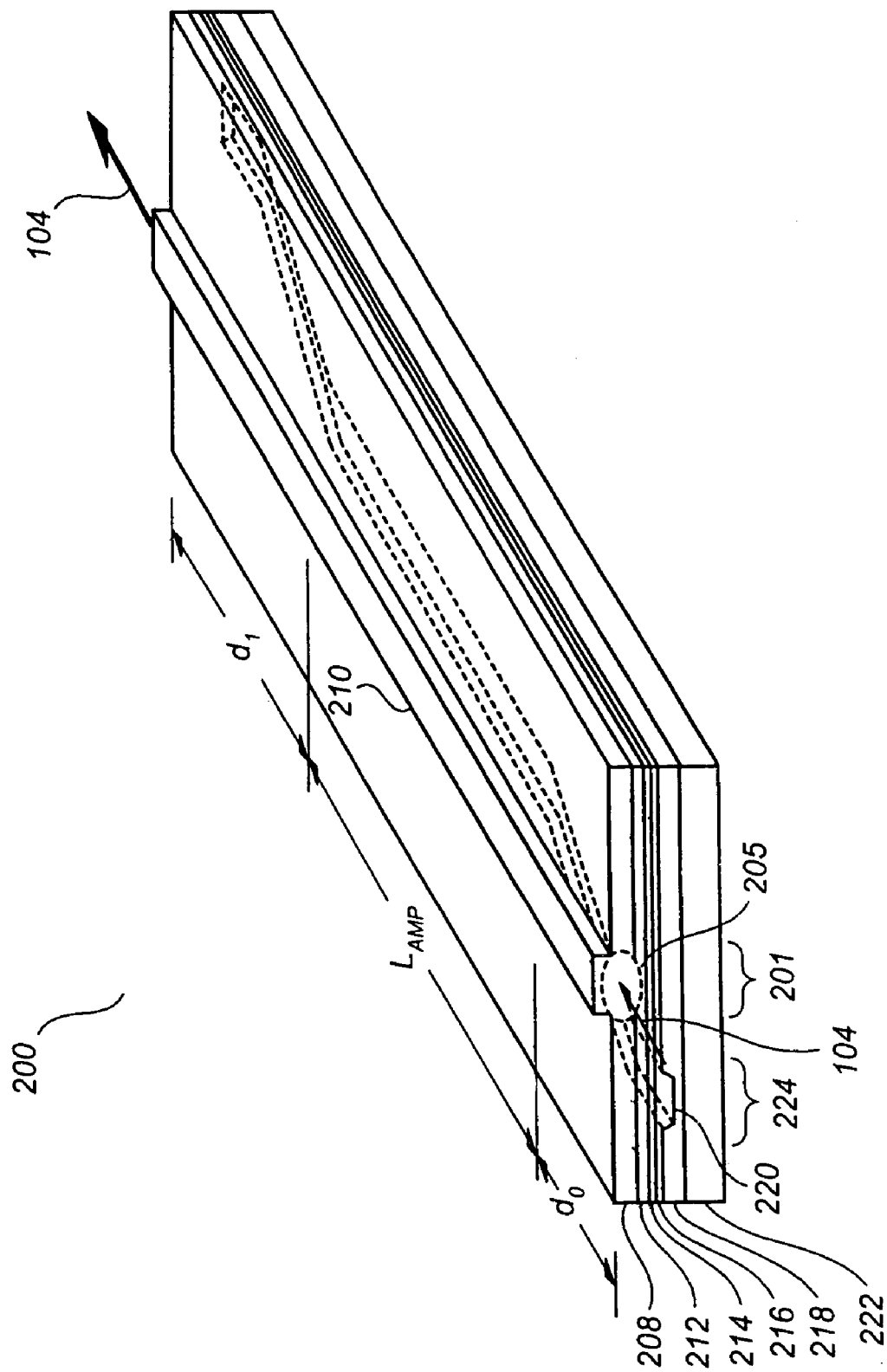
FIG. 2 illustrates a perspective view of an SOA in accordance with a preferred embodiment.

FIG. 2 illustrates a perspective-view of an SOA 200 in accordance with a preferred embodiment. SOA 200 comprises material layers 208, 212-218, and 222 similar to the material layers 108, 112-118, and 122 of FIG. 1, respectively. However, SOA 200 comprises a straight ridge element 210 laterally defining a straight signal waveguide 201 and straight optical path 205, and SOA 200 comprises a crooked-path rib element 220 laterally defining a laser cavity 224. The operation of SOA 200 is similar to the operation of SOA 102 of FIG. 1 except that the optical signal 104 follows a straight path for the entire length of the device, while the laser cavity 224 follows the crooked path. Generally speaking, when the lasing cavity must be separated from the signal path near the ends of the device to enable easier optical coupling to the outside world, it is preferable that the lasing cavity follow a crooked trajectory and that the signal waveguide follow a straight trajectory (as in FIG. 2) rather than vice versa (as in FIG. 1). This avoids losses in the optical signal 104 due to optical path bending. Furthermore, optical path bending losses in the crooked laser cavity are more easily dealt with, e.g., by increasing the laser excitation current. The amount of evanescent coupling experienced in the evanescent coupling region formed along the length $L_{AMP}$ is similar to that of the SOA 100 of FIG. 1.

Figure 3:
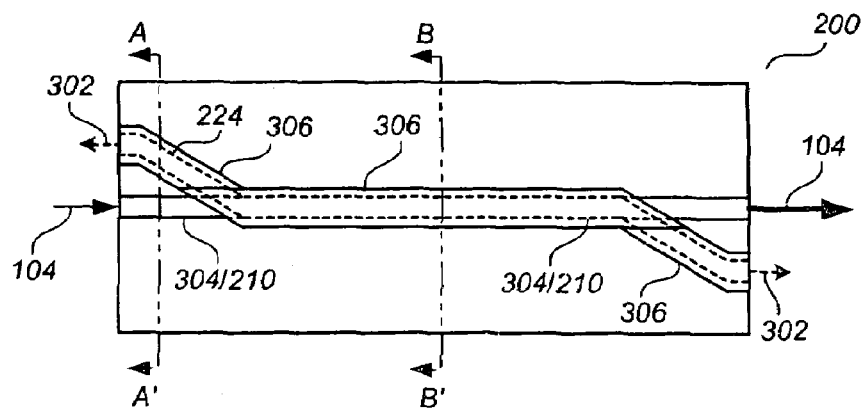
FIG. 3 illustrates a top view of the SOA of FIG. 2.

FIG. 3 illustrates a top view of the SOA 200 of FIG. 2 that includes further detail regarding the electrical contacts for the laser cavity 224. In particular, along the top of the ridge element 210 is an intermediate ohmic contact 304 comprising a low band gap material such as heavily p-doped InGaAsP. A metallic contact 306 is formed above the path of the laser cavity, being formed on top of the intermediate ohmic contact 304 when coinciding with the ridge element 210. Also shown in FIG. 3 is laser output light 302 which, depending on the reflectivities of the material placed at the ends of the laser cavity 224, can be emitted from one or from both ends of the laser cavity 224. The laser output light 302 generally remains unused. Importantly, the laser output light 302 should be kept away from the output path of the optical signal 104.

As indicated in FIG. 3, the metallic contact 306 needs to "climb" up the sides of the ridge element 210 during certain intervals. Generally speaking, this presents no special problems in the fabrication of the SOA 200, especially if the ridge element 210 is formed by a wet etching process that results in sloped, rather than purely vertical, side walls.

Figure 4:
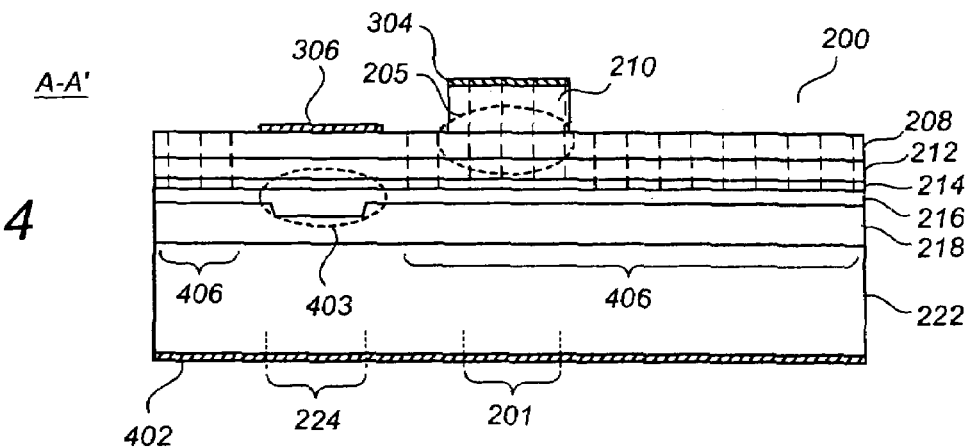
FIG. 4 illustrates a first cross-sectional view of the SOA of FIG. 2.
Figure 5:
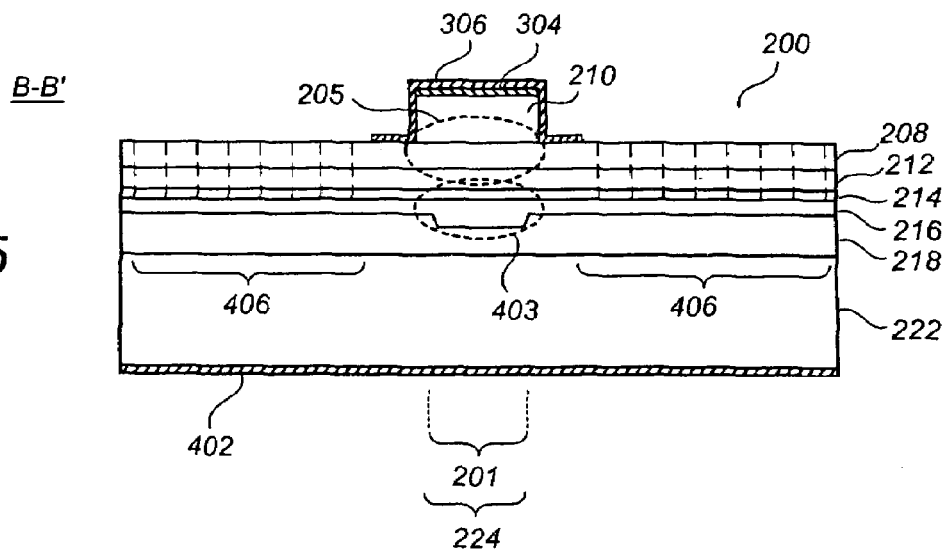
FIG. 5 illustrates a second cross-sectional view of the SOA of FIG. 2.

FIGS. 4 and 5 illustrate the SOA 200 along a first cross-sectional view A-A' and a second cross-sectional view B-B', respectively. Shown in these views is a lower ohmic contact 402 and proton implanted regions 406 lying adjacent to the laser cavity 224. Importantly, subsequent to the growth of the material layer from which ridge element 210 will be formed, the wafer must be proton implanted in all regions except along the laser cavity 224, thereby forming proton implanted regions 406. The depth of the proton implantation regions 406 can vary somewhat but generally must be deep enough to penetrate the active gain medium layer 214. As known in the art, the proton-implanted regions 406 are electrically nonconductive, and therefore current will be confined to the laser cavity 224 as desired. Also shown in FIGS. 4-5 are dotted-line regions that approximate electromagnetic field boundaries of the optical signal path 205 and a lasing field path 403. As indicated in FIG. 5, these fields will at least slightly overlap when the signal waveguide 201 lies near the laser cavity 224, consistent with the evanescent coupling that exists between the signal waveguide 201 and laser cavity 224, and energy from the lasing field will be coupled into the signal waveguide 201 to amplify the optical signal 104.

Figure 6:
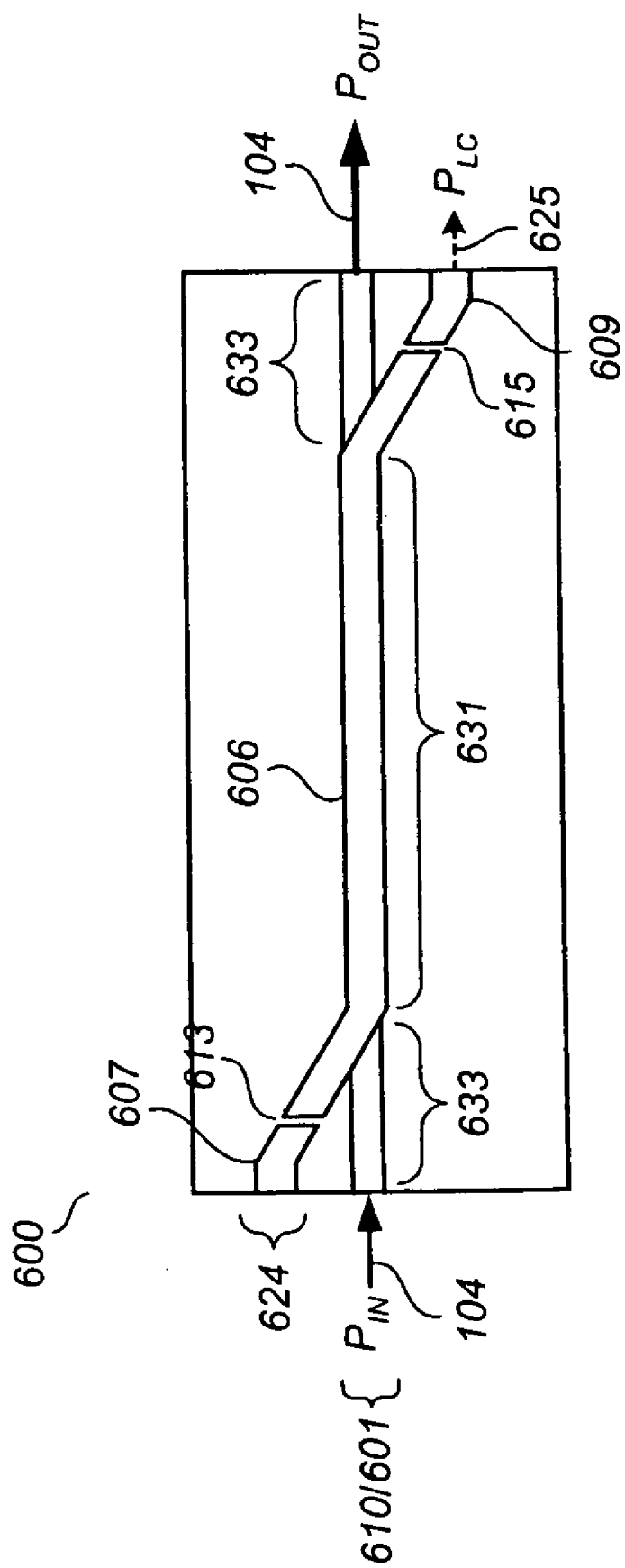
FIG. 6 illustrates a top view of an SOA in accordance with a preferred embodiment.

FIG. 6 illustrates a top view of an SOA 600 in accordance with a preferred embodiment. SOA 600 is similar to the SOA 200 of FIG. 2, comprising a signal waveguide 601 laterally defined by a ridge element 610 and a laser cavity 624 positioned near the signal waveguide 601, except that the laser cavity 624 of SOA 600 is segmented into three different sections between its end mirrors. The three sections are electrically isolated from each other and supplied with different currents from separate electrical contacts. In particular, a main electrical contact 606 supplies electrical current to the central part of the laser cavity 624 that passes near the optical signal path, while end electrical contacts 607 and 609 supply electrical current to end portions of the laser cavity 624.

The SOA 600 is proton-implanted in connecting strips 613 and 615, also termed intra-laser cavity segmentation strips, lying between the respective laser segments to provide electrical isolation among the sections. Preferably, because optical losses in a non-excited, non-disordered gain medium can be quite large, the gain medium of the laser cavity 624 is disordered along the connecting strips 613 and 615 to minimize optical losses at these locations. Alternatively, the gain medium is left intact along the connecting strips 613 and 615, and the electrical resistivity profiles therein are tailored in a manner similar to that described in U.S. Ser. No. 09/972,146, filed Oct. 4, 2001, supra, such that a modest amount of excitation current sufficient to pump the gain medium to transparency bleeds over from the adjacent laser cavity segments.

Explicitly indicated in FIG. 6 is an evanescent coupling region 631 that is formed at areas where the signal waveguide 601 vertically coincides with the laser cavity 224. Areas along the signal waveguide 610 that are not in the evanescent coupling region 631 are identified as regions 633. Preferably, the gain medium layer of the SOA 600 is also disordered underneath the signal waveguide 601 at regions 633 lying outside the evanescent coupling region 631, for reducing signal loss in those areas. Alternatively, the regions 633 can be bypassed altogether by trenching a V-shaped groove inward along the end regions 633 and etching new signal waveguide end facets very close to the evanescent coupling region 633. The V-shaped groove accommodates placement of the new end facets and also provides physical support for the optical fibers. The lasing path of the laser cavity 624 follows a crooked or S-like trajectory between its end mirrors.

As indicated by the single laser cavity output 625 in FIG. 6 having an output power of $P_{LC}$, it is presumed herein that one end of the laser cavity 624 has a fully reflective mirror and therefore all optical laser power $P_{LC}$ is emitted out the other end. According to a preferred embodiment, the different segments of the laser cavity 624 are pumped with different excitation currents to achieve one or more desired effects in the operation of SOA 600. According to a preferred embodiment, when the laser cavity 624 is lasing, electrical current through the end segments 607 and 609 may be varied to adjust the amount of signal gain achieved in the main portion 606, thus achieving the result of gain adjustability while also achieving the result of clamped gain operation.

Figures 7, 8A:
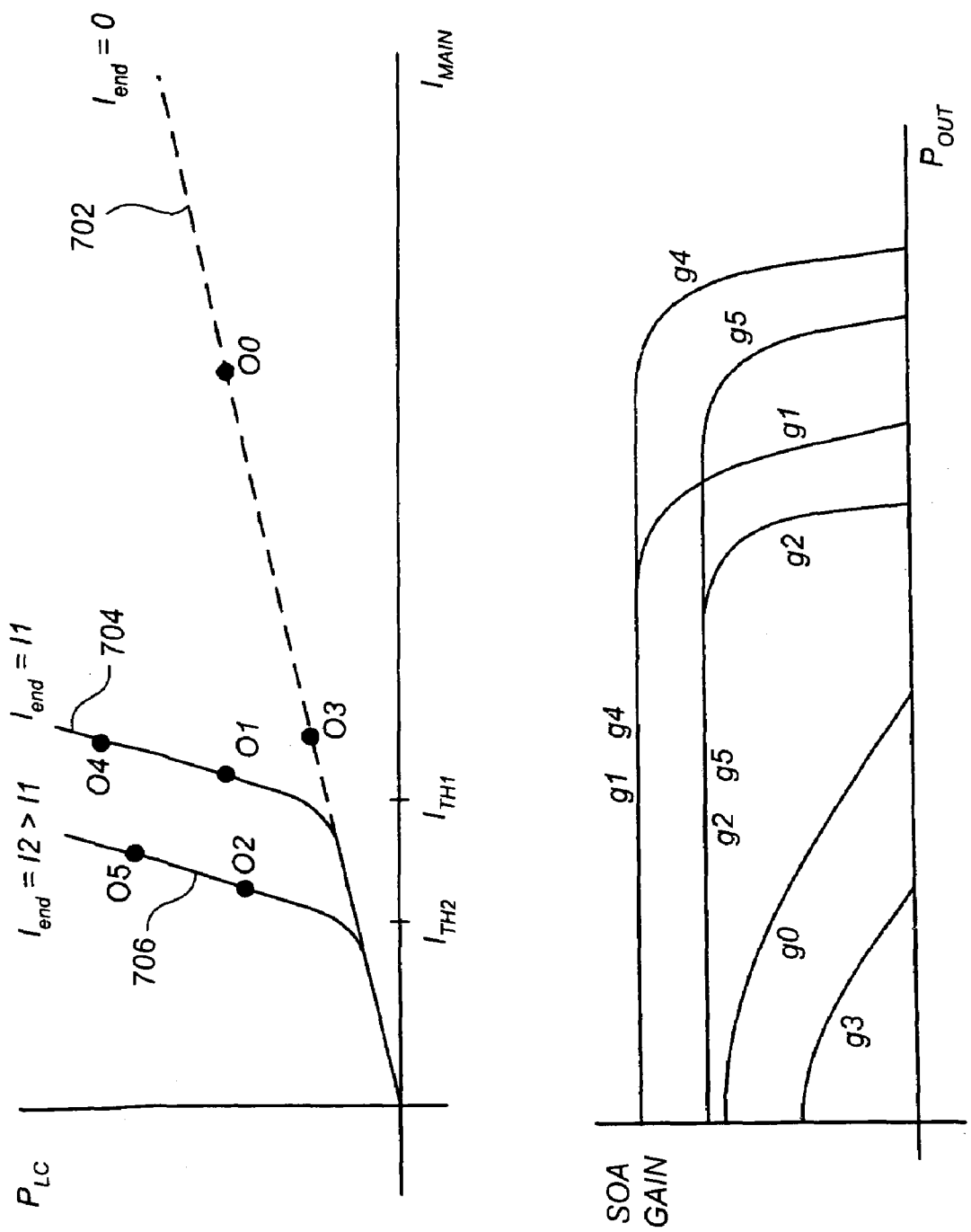
FIG. 7 illustrates a conceptual plot of emitted laser power versus excitation currents in the SOA of FIG. 6.
FIG. 8A illustrates a conceptual plot of SOA gain versus output signal power in the SOA of FIG. 6.

FIG. 7 illustrates a conceptual plot of emitted laser power $P_{LC}$ versus excitation currents in the SOA of FIG. 6. FIG. 8A illustrates a conceptual plot of SOA gain $P_{OUT}/P_{IN}$ versus output signal power $P_{OUT}$ for the optical signal 104. For simplicity and clarity of disclosure, it will be presumed that the electrical currents supplied to the end portions 607 and 609 are identical and represented by the single variable $I_{end}$, it being understood that the scope of the preferred embodiments is not so limited. Indeed, it is to be appreciated that effects similar to those described herein can be realized with only one end segment instead of two end segments as in the example of FIG. 6, or alternatively can be realized with more than two end segments without departing from the scope of the preferred embodiments. A first curve 702 shows output laser power $P_{LC}$ versus excitation current $I_{MAIN}$ in the main laser cavity 606 when $I_{end}=0$. In this situation, the ends of the laser cavity 624 are "dark" and lasing is inhibited for all practical values of $I_{MAIN}$. At both exemplary operating points O0 and O3 of FIG. 7, there is no lasing action in the laser cavity 624, and only spontaneous emission occurs. In FIG. 8A, the gain curve g0 corresponds to the operating point O0 in FIG. 7, the gain curve g3 corresponds to the operating point O3 in FIG. 7, and so on. As indicated by the gain curves g0 and g3, there is no gain clamping in this region of operation, and for all but the lowest signal powers the SOA will experience signal dependent gain, crosstalk, and other adverse effects due to gain saturation effects.

However, when end segment current $I_{end}$ is increased to an intermediate level I1, the ends of the laser cavity 624 begin to facilitate lasing action such that, if the main segment current $I_{MAIN}$ is increased past a first threshold level $I_{TH1}$, lasing action occurs. Shown in FIG. 7 is a curve 704 corresponding $I_{end}$=I1, including operating points O1 and O4. Provided that the laser cavity 624 is lasing, the optical signal gains g1 and g4 corresponding to O1 and O4, respectively, are clamped to the same value. However, although the SOA gains are the same for operating points O1 and O4, the SOA optical saturation power (i.e., the output power level at which the gain curves g1 and g4 drop off by −3 dB or more in FIG. 8A) is higher for the operating point O4 than for the operating point O1. This is consistent with the fact that the excitation current $I_{MAIN}$ is greater for operating point O4 than for operating point O1, and hence the photon density is higher.

When the end segment current $I_{end}$ is increased to an even greater level I2, the ends of the laser cavity 624 facilitate lasing action even more. This, in turn, reduces the amount of main segment current $I_{MAIN}$ needed to cause lasing action. Curve 706 corresponds to the greater end segment current $I_{end}$=I2, including operating points O2 and O5. Again, provided that the laser cavity 624 is lasing, the optical signal gains g2 and g5 corresponding to O2 and O5, respectively, are clamped to the same value. Again, the SOA saturation power for operating point O5 is higher than the SOA saturation power for operating point O2, consistent with the fact that its corresponding main segment current level $I_{MAIN}$ is greater. In accordance with a preferred embodiment, and as will be described further infra, the end segment current $I_{end}$ may be advantageously adjusted to achieve different power, gain, and/or noise-reducing objectives, which becomes particularly useful when multiple lasing cavities are used to provide amplification energy for the optical signal 104.

Figure 8B:
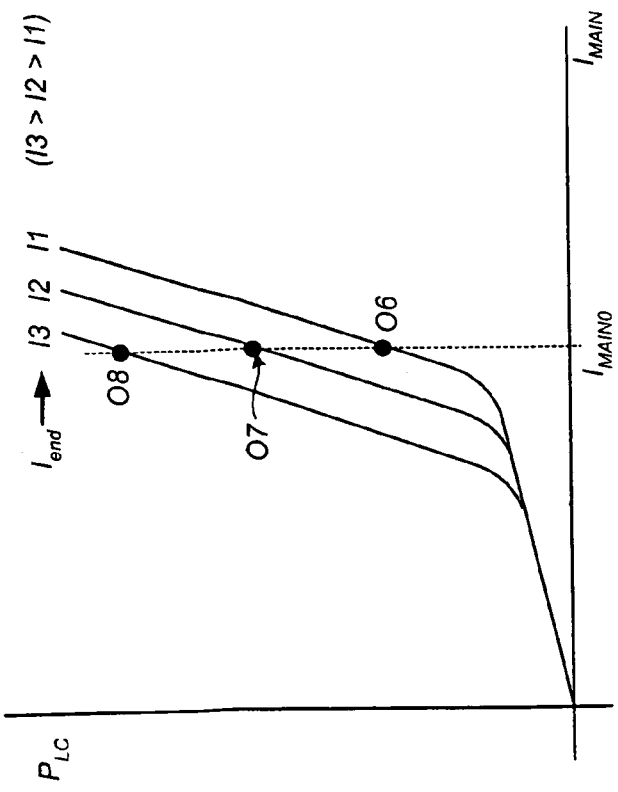
FIG. 8B illustrates a conceptual plot of emitted laser power versus excitation currents in the SOA of FIG. 6.
Figure 8C:
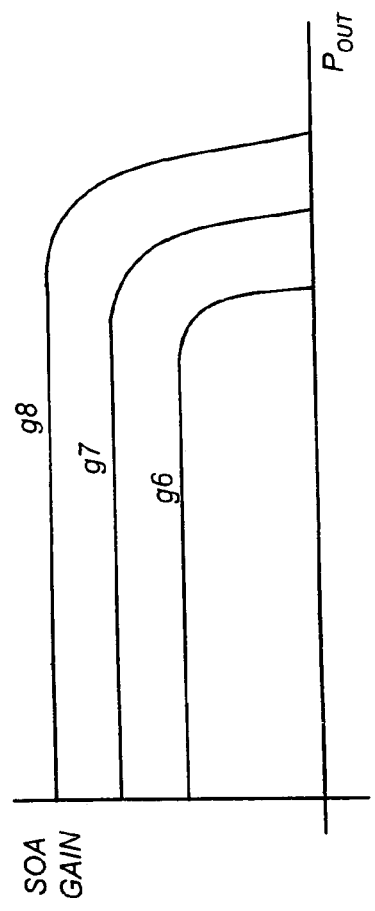
FIG. 8C illustrates a conceptual plot of SOA gain versus output signal power in the SOA of FIG. 6.

FIG. 8B illustrates a conceptual plot of emitted laser power $P_{LC}$ versus excitation current $I_{MAIN}$, and FIG. 8C illustrates a conceptual plot of SOA gain $P_{OUT}/P_{IN}$ versus output signal power $P_{OUT}$ for the optical signal 104, for the SOA of FIG. 6 at different operating points O6, O7, and O8. In this example, the main segment current $I_{MAIN}$ is kept constant at a value $I_{MAIN0}$, while the end current $I_{end}$ is varied. As illustrated in FIG. 8C, if the main segment current $I_{MAIN}$ is kept constant above the lasing threshold, the SOA gain and saturation power both increase with increasing amounts of end current $I_{end}$.

FIG. 9 illustrates a conceptual curve 900 of optical medium gain per unit distance versus wavelength corresponding to the active medium of the SOA 200 or 600 for a fixed excitation current. By way of example, for an SOA based on known InGaAsP/InGaAs/InP gain media, the total width of the curve 900 may extend from about 1500 nm to 1580 nm. As used herein, the term "wavelength region of operation" denotes the specified set of wavelengths for which an SOA will properly amplify an optical signal according to desired parameters. For any SOA, of course, the wavelength region of operation must lie somewhere inside the curve 900 of FIG. 9. More particularly, the wavelength region of operation is selected along a portion of the curve 900 where there is high and reasonably constant gain for proper operation, e.g., the region 902 of FIG. 9 extending from a lower operating wavelength $\lambda_{min}$ to an upper operating wavelength $\lambda_{max}$. By way of example, the wavelength region of operation 902 may extend from $\lambda_{min}$=1520 nm to $\lambda_{max}$=1560 nm.

Importantly, for usability reasons, it is desirable to provide an SOA with a continuous wavelength region of operation 902 that, in addition to having a low ASE level, is substantially free of extraneous optical signals in that wavelength region. Preferably, if extraneous signals do exist in the output due to the way the SOA operates, these extraneous signals should be at wavelengths lying outside the operating range $[\lambda_{min}, \lambda_{max}]$ so they can be filtered out. As used herein, the term "excitation wavelength(s)" refers to the wavelength(s) at which the laser cavity of the SOA 200 or 600 is lasing. According to a preferred embodiment, to ensure that the amplified output is substantially free of extraneous optical signals in the wavelength region of operation, the nominal excitation wavelength of the laser cavity that is positioned near the optical signal path is kept outside the wavelength region of operation 902, but sufficiently inside the curve 900 to provide sufficient excitation of the gain medium. In this way, if light from the laser cavity leaks into the output by one or more undesired effects (some of which are avoidable and some not), these extraneous signals can be filtered out.

According to a preferred embodiment, an SOA such as the SOA 200 of FIG. 2 is provided having a wavelength region of operation such as region 902 of FIG. 9, while having a nominal excitation wavelength that lies within region 906 separated from the wavelength region of operation 902 by a buffer region 904. The buffer region 904 has a predetermined width selected such that any extraneous power that might incidentally couple from the laser cavity into the output signal can be easily filtered out using inexpensive thin film filters or other filter types. In one preferred embodiment, the buffer region 904 has a width in the range of 0.1 nm to 5 nm, with the higher widths requiring less expensive filtering equipment.

Although described above in terms of an SOA having a laser cavity separated from the signal waveguide and evanescently coupled thereto, the selection of an excitation wavelength outside the wavelength region of operation is also advantageously applied to preferred embodiments in which the gain medium of the laser cavity is coextensive with the gain medium of the signal waveguide, as described in Ser. No. 09/972,146, supra. By coextensive, it is meant that the laser cavity gain medium is integral with the signal waveguide gain medium at locations of vertical coincidence between the laser cavity and the signal waveguide, i.e., the same active material forms both the laser cavity gain medium and the signal waveguide gain medium there. Stated another way, by coextensive it is meant that the laser cavity gain medium is also laterally coincident with the signal waveguide gain medium at locations of vertical coincidence between the laser cavity and the signal waveguide. An amplification region is formed at the locations of vertical coincidence, the optical signal being amplified by virtue of a population inversion in the gain medium established by the laser cavity. The optical signal is amplified the signal amplification region using energy provided by the laser cavity.

In contrast, in the SOA of FIG. 6 and generally in the evanescent coupling cases described herein, the gain medium of the laser cavity is not coextensive with the guiding layer of the signal waveguide at locations of vertical coincidence between the laser cavity and the signal waveguide. In FIG. 6, for example, the region 631 represents the locations of vertical coincidence between the laser cavity 624 and the signal waveguide 601. The gain medium of the laser cavity is not coextensive with the guiding layer of the signal waveguide in the region 631 because there is vertical separation between them there. An amplification region is nevertheless formed in the region 631, with the optical signal still being amplified by virtue of a population inversion in the gain medium established by the laser cavity. However, it is by an evanescent coupling effect that the optical signal is amplified the signal amplification region using energy provided by the laser cavity.

Depending on the specific dimensions of the SOA 200 of FIG. 2, a substantial amount of undesired extraneous signal energy lying between $\lambda_{min}$ and $\lambda_{max}$ could potentially find its way into the output signal regardless of the nominal excitation wavelength. This is an undesired phenomenon because such signals cannot be filtered out by low-cost filters and in some cases cannot be filtered out at all. A first cause of such extraneous signal leakage is conventional scattering (e.g., due to imperfections, reflections, etc.) of longitudinal modes of the laser light that intrude into the region 902 between $\lambda_{min}$ and $\lambda_{max}$. This is especially troublesome for longer lasing cavity lengths, because the number of permitted longitudinal modes falling inside the wavelength region of operation 902 can be relatively high. By way of example, for a 3 mm cavity length the longitudinal modes are spaced apart by about 0.1 nm, while for a 30 µm cavity length the spacing is about 10 nm.

A second cause of such extraneous signal energy can arise from optical injection locking effects. As known in the art, light from a master laser that is injected into a slave laser can cause the slave laser to "lock" onto the wavelengths of the master laser. Even worse, if multiple wavelengths are injected that are close enough to the nominal slave laser wavelength, the slave laser can erratically jump among the different injected wavelengths, sometimes even in a chaotic fashion. Moreover, when there are multiple laser cavities energizing the SOA (as will be described infra), these multiple cavities can start locking onto each other and, in combination with scattering effects, can cause extraneous energy between $\lambda_{min}$ and $\lambda_{max}$ to appear in the output. Injection locking effects can become particularly troublesome near the output of the SOA device where the power of the amplified optical signal might approach the order of magnitude of the power of the laser cavity. Further information on optical injection locking can be found in Bordonalli, "High-Performance Phase Locking of Wide Linewidth Semiconductor Lasers by Combined Use of Optical Injection Locking and Optical Phase-Lock Loop," J. Lightwave Tech. Vol. 17, No. 2, pp. 328-342 (February 1999), which is incorporated by reference herein.

Figure 10:
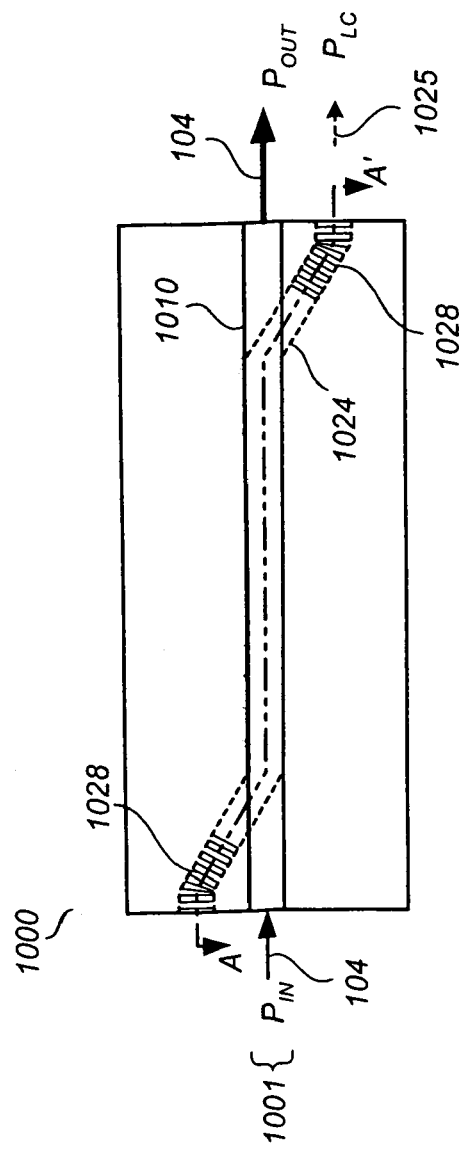
FIG. 10 illustrates a top view of an SOA in accordance with a preferred embodiment.

FIG. 10 illustrates a top view of an SOA 1000 in accordance with a preferred embodiment that minimizes extraneous output energy caused by scattering and/or optical injection locking effects by ensuring monochromatic behavior in the excitation laser cavity. The SOA 1000 is similar to the SOA 200 of FIG. 2, comprising a ridge element 1010 for guiding the optical signal 104 along a signal waveguide 1001 as well as a subsurface laser cavity 1024, except that distributed Bragg reflectors (DBRs) 1028 are provided near the end facets of the laser cavity 1024. As known in the art, DBRs 1028 can be readily inscribed that cause monochromatic operation to be achieved in the laser cavity 1024. Preferably, as shown in FIG. 10, the DBRs 1028 are formed at the ends of the laser cavity 1024 at locations that do not evanescently couple to the optical signal. This avoids unwanted filtering of the optical signal itself, as well as other excess losses. In an alternative preferred embodiment, distributed feedback laser (DFB) gratings may occupy the entire laser cavity 1024, although some undesired filtering of the optical signal itself might occur if implemented in the embodiment of FIG. 10. The DBR features 1028 may be used in combination with multiple electrical contact features, multi-segment laser cavity features, and other features described herein.

Figure 11:
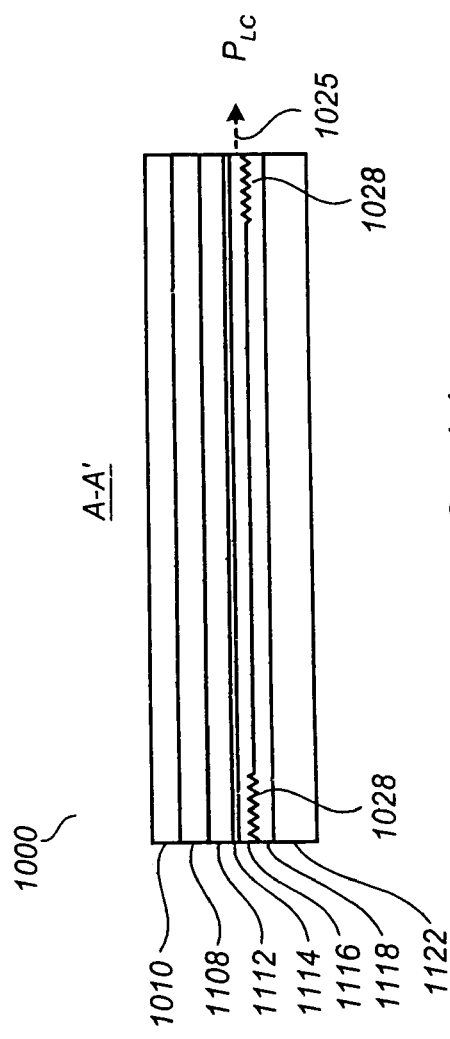
FIG. 11 illustrates a cross-sectional view of the SOA of FIG. 10.

FIG. 11 illustrates a view of the SOA 1000 of FIG. 10 along a cross-section A-A', the SOA 1000 comprising material layers 1108, 1112-1118, and 1122 similar to the material layers 208, 212-218, and 222 of FIG. 2, respectively, except that DBR grating features 1028 are inscribed into the second cladding layer 1118 prior to depositing the laser waveguiding material layer 1116. As known in the art, the inscribed gratings are generally separated by distance that is on the order of magnitude of a fraction of the lasing wavelength. When properly designed, the laser output beam 1025 will be monochromatic and will lie in one of the desired lasing ranges 906 of FIG. 9. Any of a variety of methods may be used to form DBRs and/or DFB gratings. Generally speaking, in the preferred embodiment in which DBRs are inscribed, some extraneous wavelengths might appear if the laser cavity 1024 is pumped too hard with current. In the preferred embodiment in which DFB gratings are inscribed, hard pumping of the laser cavity 1024 will be less problematic and monochromatic behavior maintained, particularly if a quarter-wave phase shifting mechanism is built into the DFB gratings as is known in the art. Although described above in terms of an SOA having a laser cavity separated from the signal waveguide and evanescently coupled thereto, the incorporation of DBRs or DFB gratings into the excitation laser cavity is also advantageously applied to preferred embodiments in which the laser cavity is coextensive with the signal waveguide, as described in Ser. No. 09/972,146, supra.

FIG. 12 illustrates a top view of an SOA 1200 in accordance with a preferred embodiment that is similar to the SOA 200 of FIG. 2 except that its laser cavity 1224 is collinear with the ridge element 1210 defining the signal waveguide 1201. Optionally, the SOA 1200 may be provided with DBRs or DFB gratings as described supra for minimizing extraneous output energy caused by scattering an/or optical injection locking effects. The SOA 1200 provides reduced signal losses as compared to the SOA 200 of FIG. 2 because there is amplification along the entire optical signal path. However, the SOA 1200 has a drawback in that there is minimal separation of the optical signal path and laser cavity outputs at the edges of the device, thereby necessitating bulk optical elements to couple light into and out of the device.

FIGS. 13 and 14 illustrate an SOA 1300 in accordance with a preferred embodiment that provides variable signal gain along the optical path by gradually increasing the evanescent coupling distance between the signal waveguide 1301 and laser cavity 1324. The SOA 1300 comprises material layers 1414-1418 and 1422 similar to the material layers 1214-1218 and 1222 of FIG. 12, respectively. However, directly above the gain medium layer 1414, a spacer layer 1411 of increasing vertical thickness is deposited during the fabrication process using any of a variety of known methods, the spacer layer 1411 having a thickness of zero at one end and a thickness of "d" at the other end. The first cladding layer 1412, guiding layer 1408, and ridge element 1310 are then formed in a normal fashion above the spacer layer 1411. The spacer layer 1411 should have an index of refraction identical to that of the first cladding layer 1412 for proper vertical confinement of the lasing field. Varying the evanescent coupling distance to adjust signal gain may be especially advantageous when achieved in conjunction with the use of multiple laser cavity segments, multiple laser cavities, and/or multiple differing laser cavity electrical excitations, whereby any of a variety of different power, gain, and/or noise-reducing objectives can be realized.

Figure 15:
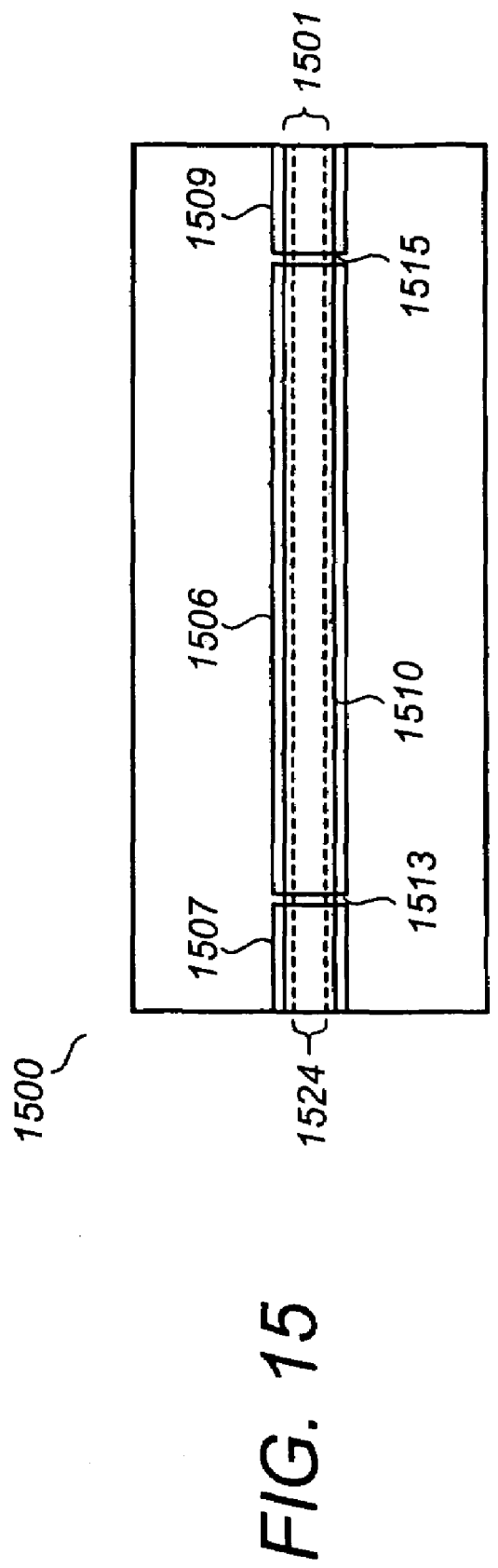
FIG. 15 illustrates a top view of an SOA in accordance with a preferred embodiment.

FIG. 15 illustrates an SOA 1500 in accordance with a preferred embodiment that is similar to the SOA 1300 of FIGS. 13-14, comprising a ridge element 1510 for guiding the optical signal along a signal waveguide 1501 as well as a collinear subsurface laser cavity 1524, but in which the laser cavity 1524 is divided into multiple segments 1507, 1506, and 1509 having different electrical contacts for permitting different electrical excitation currents. In a manner similar to the SOA 600 of FIG. 6, connecting strips 1513 and 1515 lying between successive laser segments are proton implanted for providing electrical isolation, and the active gain medium is also disordered at these locations. Alternatively, the gain medium is left ordered along the connecting strips, and the electrical resistivity profiles of the connecting strips are tailored such that a modest amount of excitation current sufficient to pump the gain medium to transparency is supplied. The SOA 1500 may optionally have DBRs or DFB gratings for purposes described supra. More generally, any of a variety of combinations of the following features according to the preferred embodiments may be used for realizing different power, gain, noise reduction, extraneous signal reduction, or other objectives: multiple laser cavity segments, multiple laser cavity electrical contacts, variable evanescent coupling gain integration of DBRs and/or DFB gratings, and other features described herein.

Figure 16:
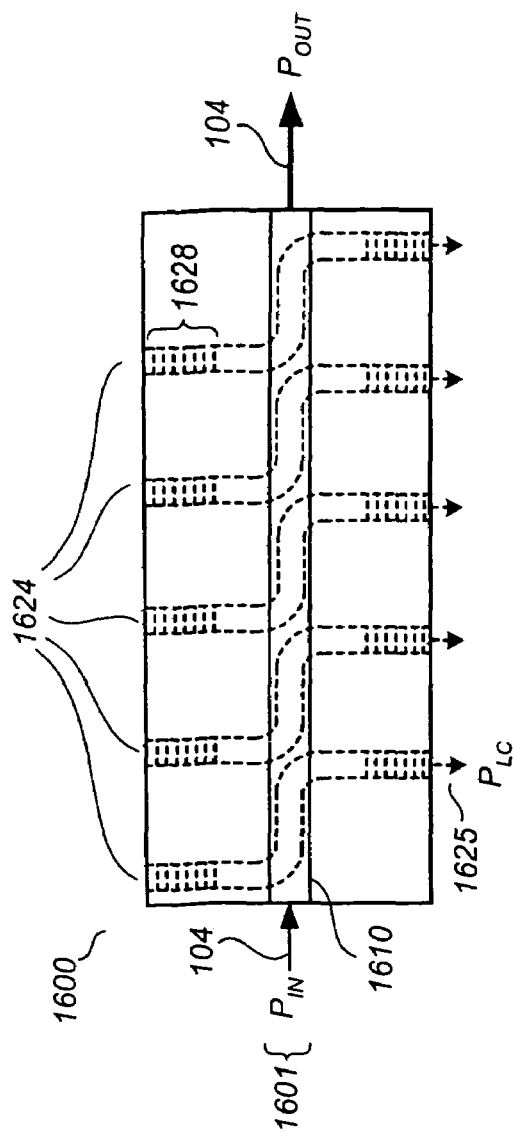
FIG. 16 illustrates a top view of an SOA in accordance with a preferred embodiment.

FIG. 16 illustrates an SOA 1600 in accordance with a preferred-embodiment, comprising multiple meandering transverse lasers 1624 that pass underneath a signal waveguide 1601 near their center portions. The lasing paths of the transverse lasers 1624 follow crooked or S-like trajectories between their end mirrors. SOA 1600 comprises material layers similar to those of SOA 200 of FIG. 2, although the materials used may be altered to accommodate sharper bends in the lasing paths of the transverse lasers 1624 using methods described, for example, in the Loncar and Joannopoulos references, supra. Because laser light 1625 is emitted in the transverse direction well away from the path of the optical signal, the power of the transverse lasers 1624 can be raised to higher levels to compensate for bending losses in the lasing paths. The overall width dimension of the SOA 1600 between the end facets (not shown) of the lasers 1624 will typically be not less than about 30 μm to permit sufficient lasing action. It is generally desirable to keep this dimension as short as possible to reduce overall electrical current requirements. Shown in FIG. 16 at the ends of each laser 1624 are DBRs 1628 that ensure monochromatic lasing activity as described supra. In accordance with a preferred embodiment, the dimensions, evanescent coupling depths, and/or electrical excitation schemes of the several transverse lasers 1624 may differ from each other for realizing different power, gain, noise reduction, extraneous signal reduction, and other objectives.

Figure 17:
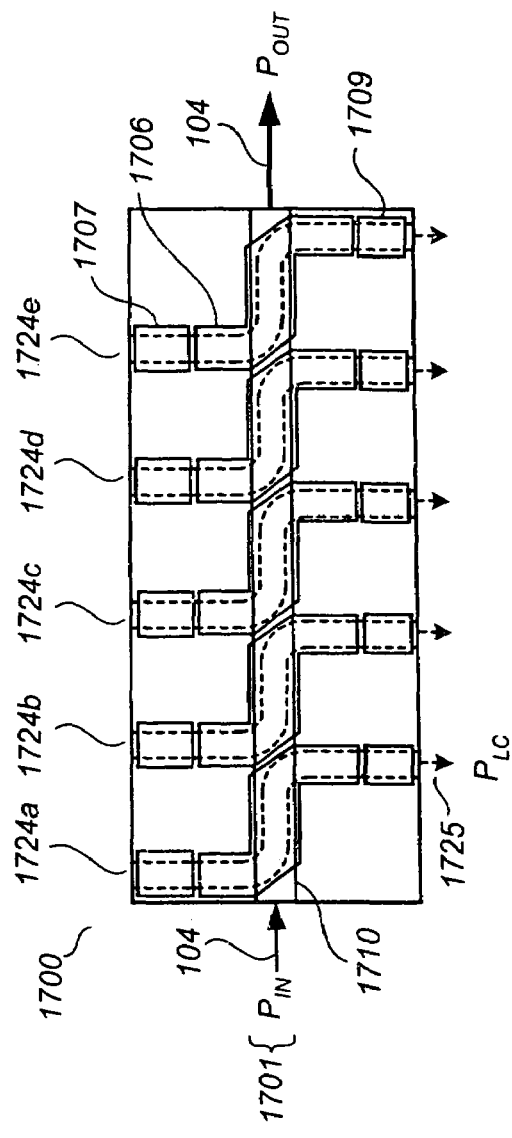
FIG. 17 illustrates a top view of an SOA in accordance with a preferred embodiment.

FIG. 17 illustrates an SOA 1700 in accordance with a preferred embodiment, comprising multiple meandering transverse lasers 1724a-1724e that pass underneath the signal waveguide 1701 near their center portions. The SOA 1700 is similar to the SOA 1600 except that each meandering transverse laser cavity is segmented into three segments, with each of the three segments being separately electrically excited by electrical contacts 1707, 1706, and 1709. The connecting strips lying between successive laser segments are proton implanted for providing electrical isolation, and the active gain medium is also disordered at these locations. Alternatively, the gain medium is left ordered along the connecting strips, and the electrical resistivity profiles of the connecting strips are tailored such that a modest amount of excitation current sufficient to pump the gain medium to transparency is supplied.

According to a preferred embodiment, the meandering transverse laser cavities 1724a-1724e are identical to each other, but their excitation currents differ so as to provide improved ASE noise performance. Exemplary schemes for adjusting the excitation currents for provide improved ASE noise performance are described infra with respect to FIGS. 22-24C.

According to an alternative preferred embodiment, equivalent ASE reduction and/or other useful results are obtained by varying the end mirror reflectivities while keeping the excitation currents the same. In particular, where an end segment excitation current (e.g., the current through segments 1707/1709 of FIG. 17) would be decreased, an equivalent result could be obtained by decreasing the end mirror reflectivity. Where an end segment excitation current would be increased, an equivalent result could be obtained by increasing the end mirror reflectivity.

According to another preferred embodiment, equivalent ASE reduction and/or other useful results are obtained by varying the material characteristics of the gain medium itself across the successive laser cavities. By way of example and not by way of limitation, where bulk active $In_xGa_{1-x}As_yP_{1-y}$ is used in the gain medium, the variables x and y can be varied during fabrication. As a further example, differing oxide preferential growth processes and/or other fabrication variations may be applied in forming the gain medium portions of successive laser cavities. In still another preferred embodiment, the thickness of the gain medium is altered among successive laser cavities. In still another preferred embodiment, cavity width and/or depth are altered among successive laser cavities. Various combinations of the above items, which include excitation current magnitudes, end mirror reflectivities, gain medium materials, gain medium thicknesses, and cavity dimensions can be varied to achieve ASE reduction and/or other useful results according to the preferred embodiments. Generally speaking, however, the only parameters dynamically changeable during device operation are the successive excitation currents (or the successive injected photon densities for optical injection pumping), with the remaining parameters being fixed after the device is fabricated.

Figure 18:
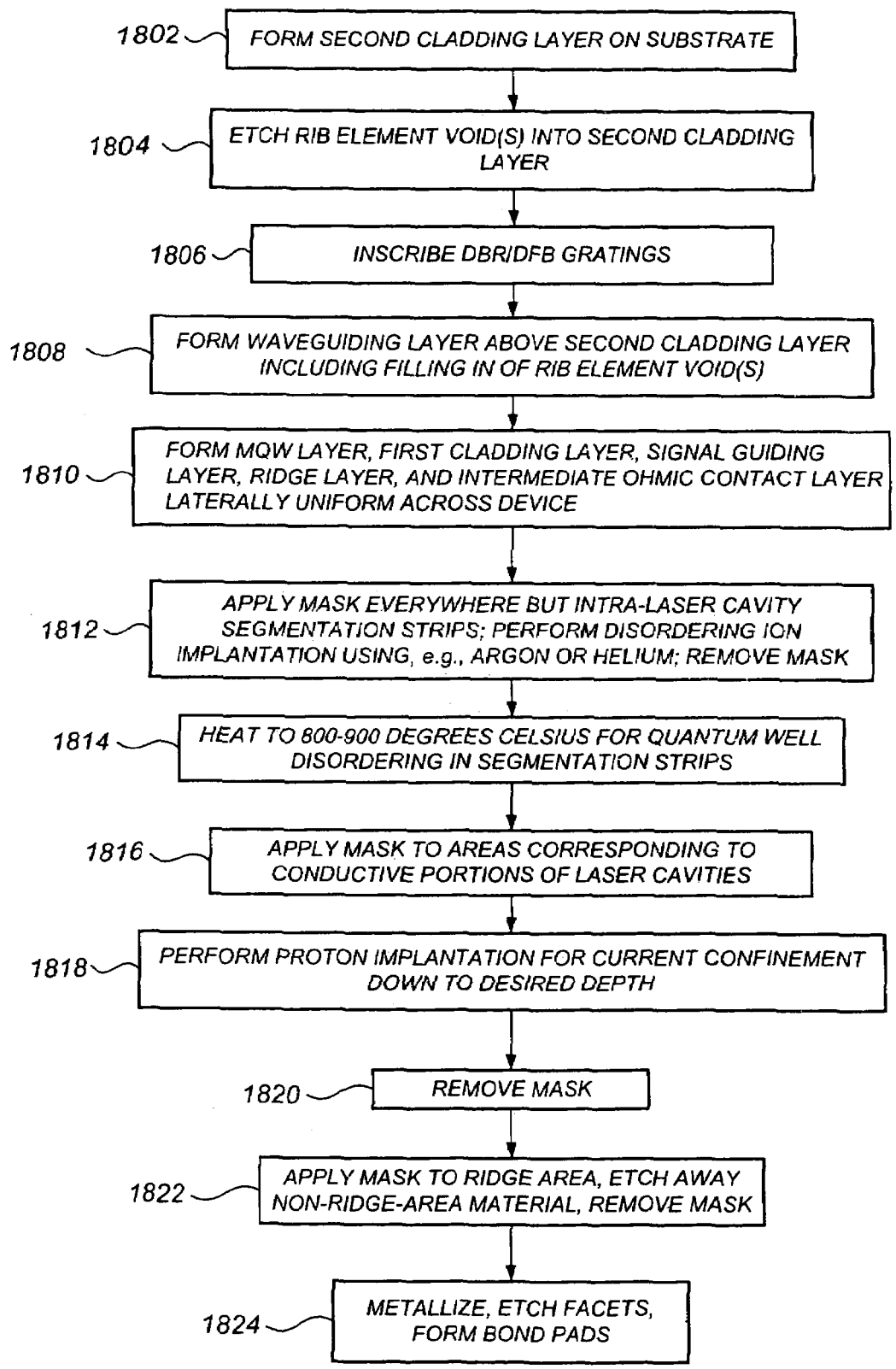
FIG. 18 illustrates steps for fabricating an SOA in accordance with a preferred embodiment.

FIG. 18 illustrates steps for fabricating an SOA in accordance with a preferred embodiment. The beginning substrate, comprising for example an InP substrate material, will generally be larger in both width and length than the finished SOA itself. At step 1802, beginning with a substrate such as an InP substrate, an n-InP cladding layer is formed on the substrate that, with respect to the exemplary embodiment of FIG. 2, corresponds to second cladding layer 218. At step 1804, a void corresponding to the rib element 220 is etched into the second cladding layer. In preferred embodiments in which multiple laser cavities are formed, there will be multiple such voids formed. At step 1806, DBRs and/or DFB gratings are inscribed. It is to be appreciated that the DBR/DFB gratings may be formed in layers other than the second cladding layer 218, or may be formed in other ways such as by variation of the refractive index of the waveguide material or by lateral formation or bonding of DBR structures onto the ends of the laser cavities. At step 1808 the waveguiding layer 216, comprising for example waveguiding n-InGaAsP, is formed above the second cladding layer 218, which includes the filling in of the rib element void(s). If different material is used for the waveguiding layer 216, it should have an index of refraction sufficiently different than the index of refraction of the second cladding layer 218 to effectuate the DBR/DFB gratings. At step 1810 the gain medium layer 214 is formed, comprising for example bulk active indium gallium arsenide phosphide, e.g., $In_{0.7}Ga_{0.3}As_{0.7}P_{0.3}$, or multiple quantum wells (MQWs) according to a InGaAsP/InGaAs/InP material system. Also at step 1810 the first cladding layer 212 is formed, comprising for example p-InP, and signal guiding layer 208 is formed, comprising for example waveguiding p-InGaAsP. Also at step 1810, a laterally uniform layer of p-InP is formed that will eventually become the ridge element 210, and a thin, laterally uniform layer of heavily doped p-InGaAsP is formed that will eventually become the intermediate ohmic contact layer 304.

At step 1812, a mask is applied at all locations except those corresponding to intra-laser cavity segmentation strips (e.g., the strips 613 and 615 of FIG. 6), a disordering ion implantation is performed, e.g., using argon or helium, and the mask is removed. At step 1814, the wafer is heated to 800-900 degrees Celsius momentarily to achieve quantum well disordering in the segmentation strips.

At step 1816, a mask is deposited across all areas corresponding to electrically conductive laser portions. For the preferred embodiment of FIG. 2, this mask is simply formed along a continuous strip above the rib element 220. However, there will be several such strips when multiple laser cavities are formed. If the laser cavity or cavities are to be segmented into plural, electrically separate segments, there will be a separate mask element for each such segment. At step 1818 the wafer is proton implanted down to the desired depth, which is usually a predetermined distance below the gain medium layer 214, and at step 1820 the mask is removed. At step 1822, a mask is applied to an area corresponding to ridge element 210, the intermediate ohmic contact layer and ridge layers are etched away at all non-masked locations to form the intermediate ohmic contact 304 and ridge element 210, and the mask is removed. Step 1822 preferably comprises a wet etch process, which will cause the side walls of the ridge element 210 to be gently sloped for facilitating subsequent metallization.

At step 1824, the end facets are formed. For end facets that are on the sides of the device as in FIG. 16, a dry etching process is usually required because the end facets are so close together (e.g., 30 µm-100 µm). Any of a variety of known III-V material dry etching methods may be used. Cleaving or dry etching may be used to form the longitudinal end facets near the input and output of the device. Antireflection coatings are applied at the longitudinal end facets near the signal waveguide, and partially reflective coatings are applied at the longitudinal end facets near the laser cavity if required. Also at step 1824, the steps of metallization, formation of bonds pads, etc. are performed using known methods. A polyimide filling layer is formed on the substrate adjacent to the SOA device to provide support for metallic connections between external bond pads and the upper electrical contacts of the laser cavities. Steps for forming optional additional optical devices on the same substrate, such as those described in FIGS. 25-28 infra, are carried out subsequent to or in parallel with the steps 1802-1824 as required.

The above steps for fabricating an SOA in accordance with a preferred embodiment were described for a p-over-n buried heterostructure laser in which the signal waveguide is placed above the gain medium layer on the "p" side. As discussed supra, in light of the present disclosure one skilled in the art would be readily able to construct the complementary n-over-p preferred embodiment, in which the signal waveguide is placed on the "n" side of the gain medium.

Figure 19A:
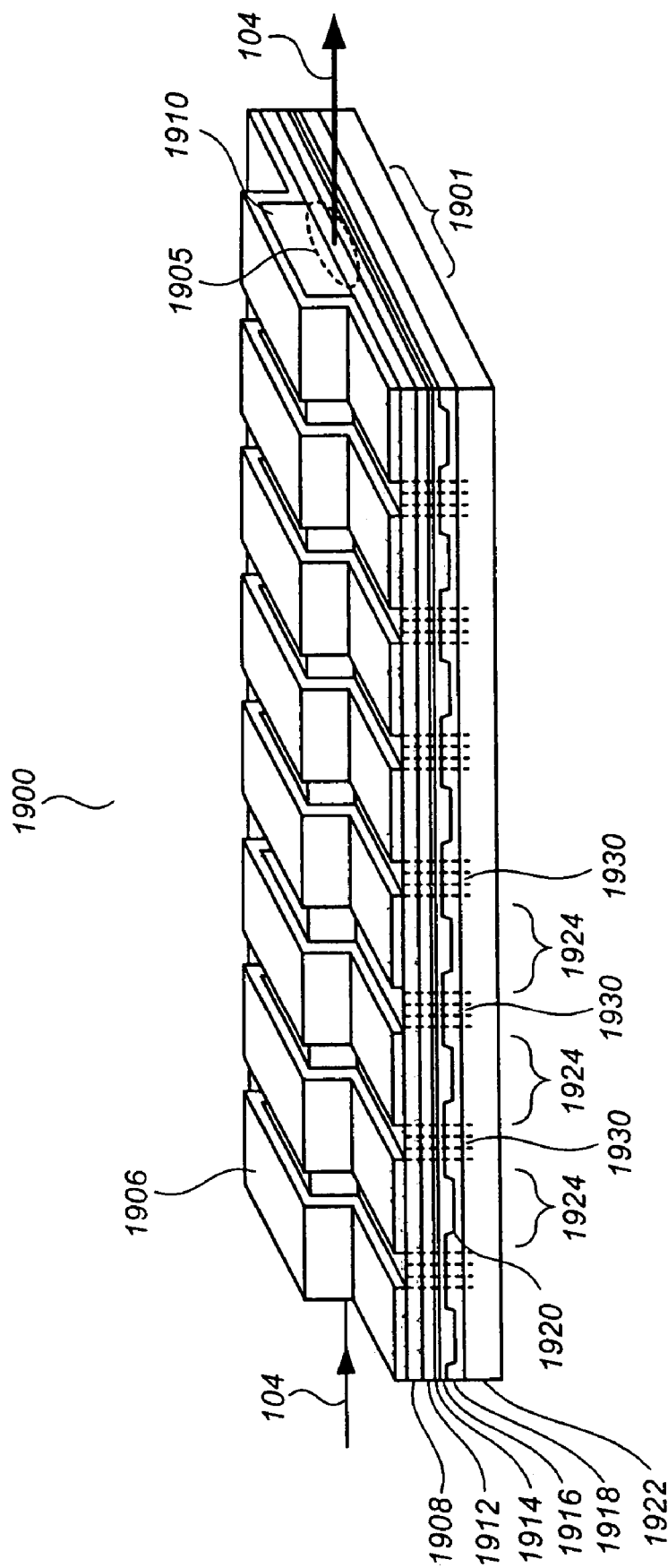
FIGS. 19A and 19B illustrate perspective views of an SOA in accordance with a preferred embodiment.

FIG. 19A illustrates a perspective view of an SOA 1900 in accordance with a preferred embodiment, in which an optical signal traveling down a signal waveguide is amplified by an evanescent coupling effect with a plurality of transverse laser cavities. SOA 1900 comprises material layers 1908, 1912-1918, and 1922 similar to the material layers 208, 212-218, and 222 of FIG. 2, and is similar to the SOA 1600 of FIG. 16, except that transverse laser cavities 1924 are lasing in a direction perpendicular to path of the optical signal 104 in the evanescent coupling region. The evanescent coupling regions correspond to lateral areas where the optical signal path 1905 passes near the transverse lasing fields, i.e., where the ridge element 1910 crosses over the transverse laser cavities 1924 becoming vertically coincident therewith.

The mechanism by which energy from the lasing fields is coupled into the optical signal 104 is substantially unaffected by the particular orientation of the lasing fields, and so the operating characteristics of the SOA 1900 is substantially similar to the operating characteristics of the SOAs supra. However, the geometry of the SOA 1900 allows for a greater number of separately pumped transverse laser cavities 1924, and is particularly suitable for applications in which variations of laser cavity excitation currents are varied to achieve desired effects such as noise reduction. The number of transverse laser cavities 1924 may vary greatly without departing from the scope of the preferred embodiments. For example, if the transverse laser cavities 1924 are each 20 µm wide and separated by 5 µm, and if the overall longitudinal length of the device is 0.2 mm (200 µm), there would be 8 transverse laser cavities. If the transverse laser cavities 1924 are each 10 µm wide and separated by 2 µm, and if the overall longitudinal length of the device is 2.4 mm (2400 µm), there would be 200 transverse laser cavities. It is not necessary for the transverse laser cavities 1924 to be identical to each other. By way of example, the transverse lasers 1924 may have different dimensions from each other. By way of further example, the transverse lasers 1924 may have different orientations from each other. In general, the transverse laser cavities 1924 may have substantially different characteristics that yield certain operating advantages, some examples of which are described in detail infra. As indicated in FIG. 19A, the transverse laser cavities 1924 are electrically pumped by excitation currents supplied by separate electrical contacts 1906, with electrical isolation among laser cavities being provided by proton-implanted isolation zones 1930.

Depending on separation distances between adjacent transverse laser cavities, proton implantation depths, proton implantation concentrations, layer thicknesses, and other factors, adjacent transverse laser cavities 1924 may experience optical coupling effects. When the transverse laser cavities 1924 are placed close enough together, one or more optical coupling effects among them may be advantageously used. By way of example, the operating wavelengths of adjacent lasing cavities can lock together when the laser cavities are sufficiently close together, which can ensure monochromatic operation of the laser cavities at a single, unified wavelength. As an incidental benefit, the DBR/DFB gratings on some of the transverse laser cavities could potentially be omitted without disturbing monochromatic lasing operation.

Alternatively, in other circumstances it may be desirable to minimize the amount of optical coupling between adjacent transverse laser cavities 1924. According to an alternative preferred embodiment, one or more characteristics of adjacent transverse laser cavities 1924 are varied in order to avoid optical coupling effects therebetween, as will be described further infra with respect to FIGS. 29-30.

Figure 19B:
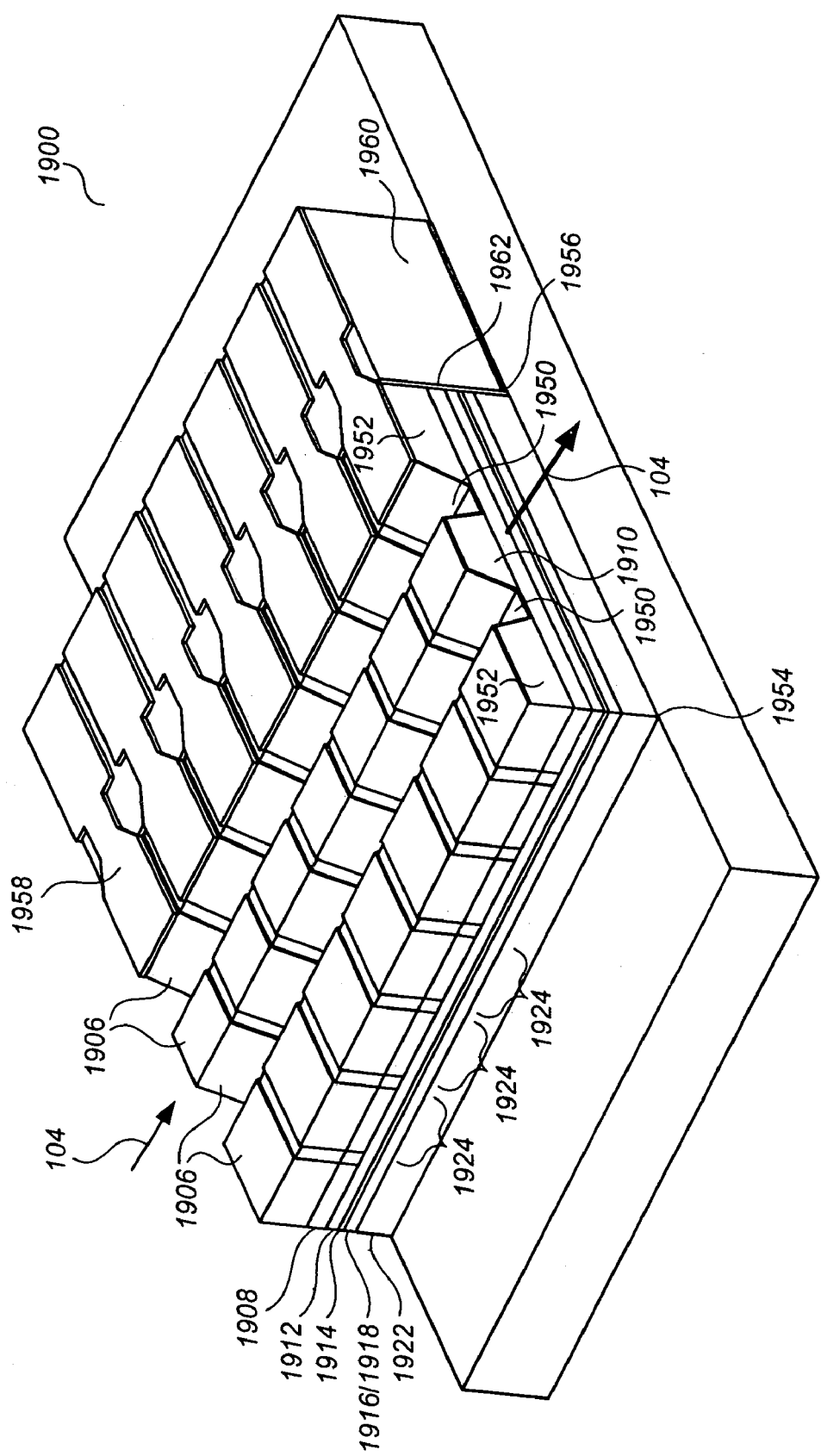

FIG. 19B illustrates a different perspective view of the SOA 1900 of FIG. 19A that, although still not to scale, is a closer conceptual illustration of the completed device. More particularly, FIG. 19B shows structural features related to the electrical contacts 1906 that were omitted for clarity in FIG. 19A. Rather than rising above the rest of the device like a mesa as implied by FIG. 19A, the ridge element 1910 is actually formed by etching groove regions 1950 on either side of the ridge element 1910. On the other side of the grooves 1950 are spacer regions 1952 comprising the same material as the ridge element 1910. The groove regions 1950 are made wide enough to ensure that the optical signal is laterally confined underneath the ridge element 1910. This configuration ensures a more consistent pumping of the gain medium along the length of the transverse laser cavities 1924 by providing consistent spacing between the electrical contacts 1906 and the gain medium layer 1914, while also providing for lateral confinement of the optical signal 104. In the embodiment of FIG. 19B, the electrical contacts 1906 extend from near the front facets 1954 to near the back facets 1956 of the transverse laser cavities 1924, experiencing a temporary downward dip at the groove regions 1950. The electrical contacts 1906 make contact with bond pads 1958, which extend beyond the back facets 1956 to make contact with external current sources. As they extend backward past the back facets 1956, the bond pads 1958 are supported by a planarization material 1960 such as polyimide. An HR coating 1962 is applied to the back facets 1956 separating the transverse laser cavities 1924 from the planarization material 1960. Because the longitudinal length of the SOA 1900 between the input and output end facets is quite long, e.g., 200 μm-2000 μm or greater, the longitudinal end facets may be cleaved. In contrast, the front facets 1954 and back facets 1956 of the transverse laser cavities are reactive ion etched laser diode facets. For clarity of representation, the rib feature details between the laser waveguiding layer 1916 and second cladding layer 1918 are omitted in FIG. 19B.

The overall width dimension of the SOA 1900 between the end facets 1954 and 1956 will typically be not less than about 30 μm to permit sufficient lasing action. It is generally desirable to keep this dimension as short as possible to reduce overall electrical current requirements. The SOA 1900 may comprise laser cavities that are in accordance with one or more of the following references, each of which is incorporated by reference herein: Hofling et. al., "Short-Cavity Edge-Emitting Lasers With Deeply Etched Distributed Bragg Mirrors," Electronics Letters, Vol.35, No.2 (Jan. 21, 1999); and Charles, P., "On-Wafer Facet Processing for Low Cost Optoelectronic Components," Electronics Letters, Vol.33, No. 16 (Jul. 31, 1997).

Figure 20:
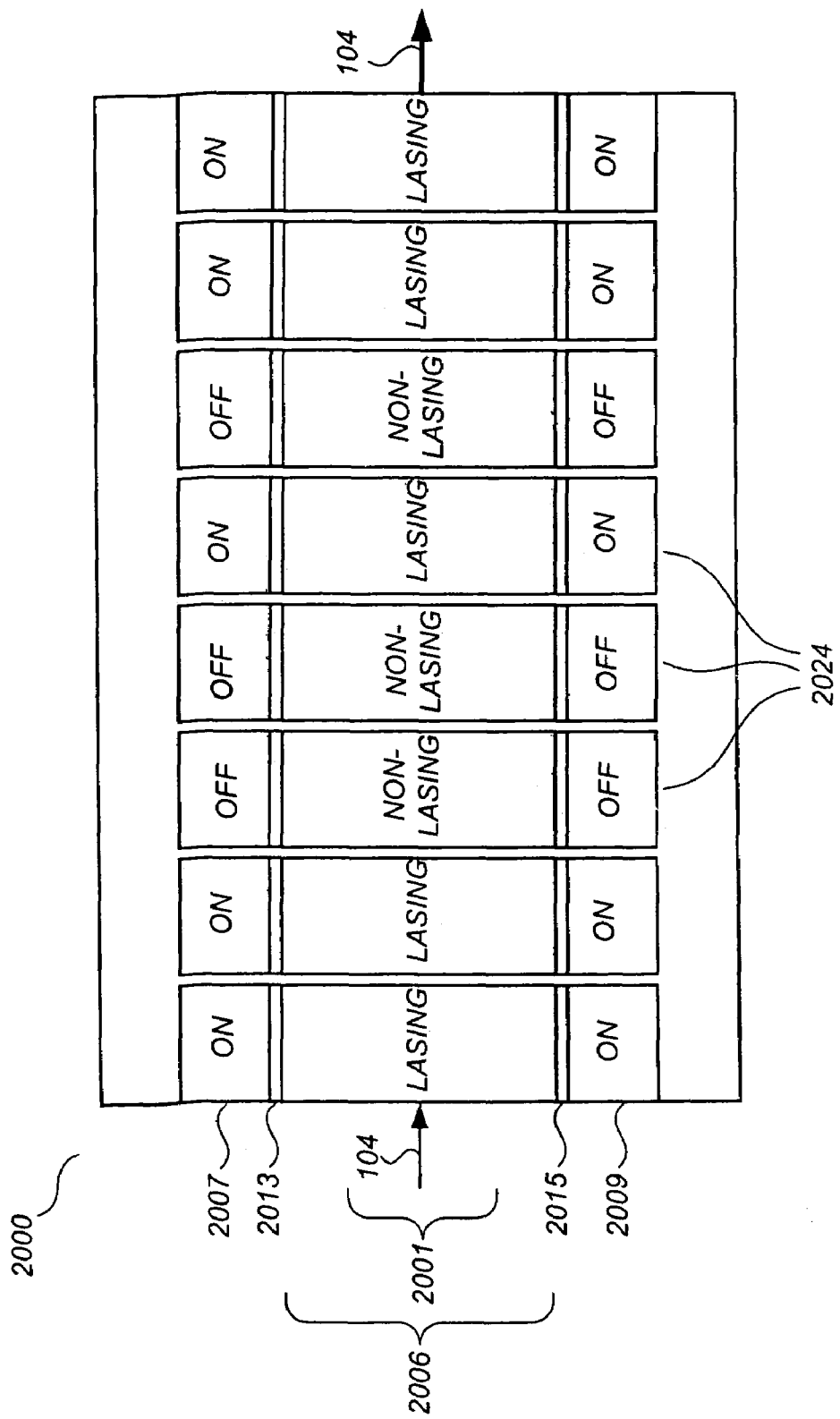
FIG. 20 illustrates a top view of an SOA in accordance with a preferred embodiment.

FIG. 20 illustrates a simplified top view of an SOA 2000 in accordance with a preferred embodiment that is similar to the SOA 1900 of FIGS. 19A-19B except that the transverse laser cavities are segmented. SOA 2000 comprises a signal waveguide 2001 that guides an optical signal 104 from an input to an output. For simplicity and clarity of disclosure, the ridge element needed to provide horizontal confinement of the optical signal 104 is omitted from FIG. 20. SOA 2000 comprises a plurality of transverse laser cavities 2024, each comprising a main segment 2006 and two end segments 2007 and 2009, respectively. Each laser cavity segment is supplied with a separate electrical pumping current. Thin ion-implanted connecting strips 2013 and 2015 divide the segments and provide electrical isolation between them, the gain medium in these strips being disordered to provide optical continuity among the segments. Alternatively, the gain medium is left ordered along the connecting strips 2013 and 2015, and the electrical resistivity profiles are tailored such that a modest amount of excitation current sufficient to pump the gain medium to transparency is provided.

According to a preferred embodiment, a first set of the transverse laser cavities 2024 may have end segments 2007/2009 that are turned "on" such that, for their respective portions of the signal waveguide 2001, there will be lasing and therefore gain-clamped amplification when the main segment 2006 has a current above a specified threshold current. However, a second set of transverse laser cavities 2024 may have end segments 2007/2009 that are turned "off" such that there is no lasing and no gain clamped amplification along their respective portions of the signal waveguide 2001. Along the non-clamped portions of the signal waveguide 2001, nonlinear effects associated with gain saturation can occur. The arrangement of "on" and "off" cavities may be fixed during operation, or alternatively may be dynamically altered or modulated with external signals to achieve a desired signal processing operation. The SOA 2000 represents a dynamically adjustable, multi-purpose optical signal processing device that allows gain-clamped amplification along a first set of longitudinal segments and non-clamped amplification along a second set of longitudinal segments. Applications for such a multi-purpose device may be found in the fields of optical gating, wavelength conversion, optical signal regeneration, signal equalization, and other fields. For example, one suitable signal equalizer in accordance with a preferred embodiment comprises a first longitudinal section having gain-clamped amplification, followed by a second longitudinal section having a non-gain clamped amplification, followed by a third longitudinal section having a gain-clamped amplification, the signal equalizer operating according to a boost-clip-boost equalization method.

While the transverse laser cavities of FIGS. 19A-19B and FIG. 20 are shown as being identical for simplicity and clarity of description, it is to be appreciated that they may vary greatly in size, shape, orientation, number of electrical contacts, material types, and other features without departing from the scope of the preferred embodiments.

Figure 21:
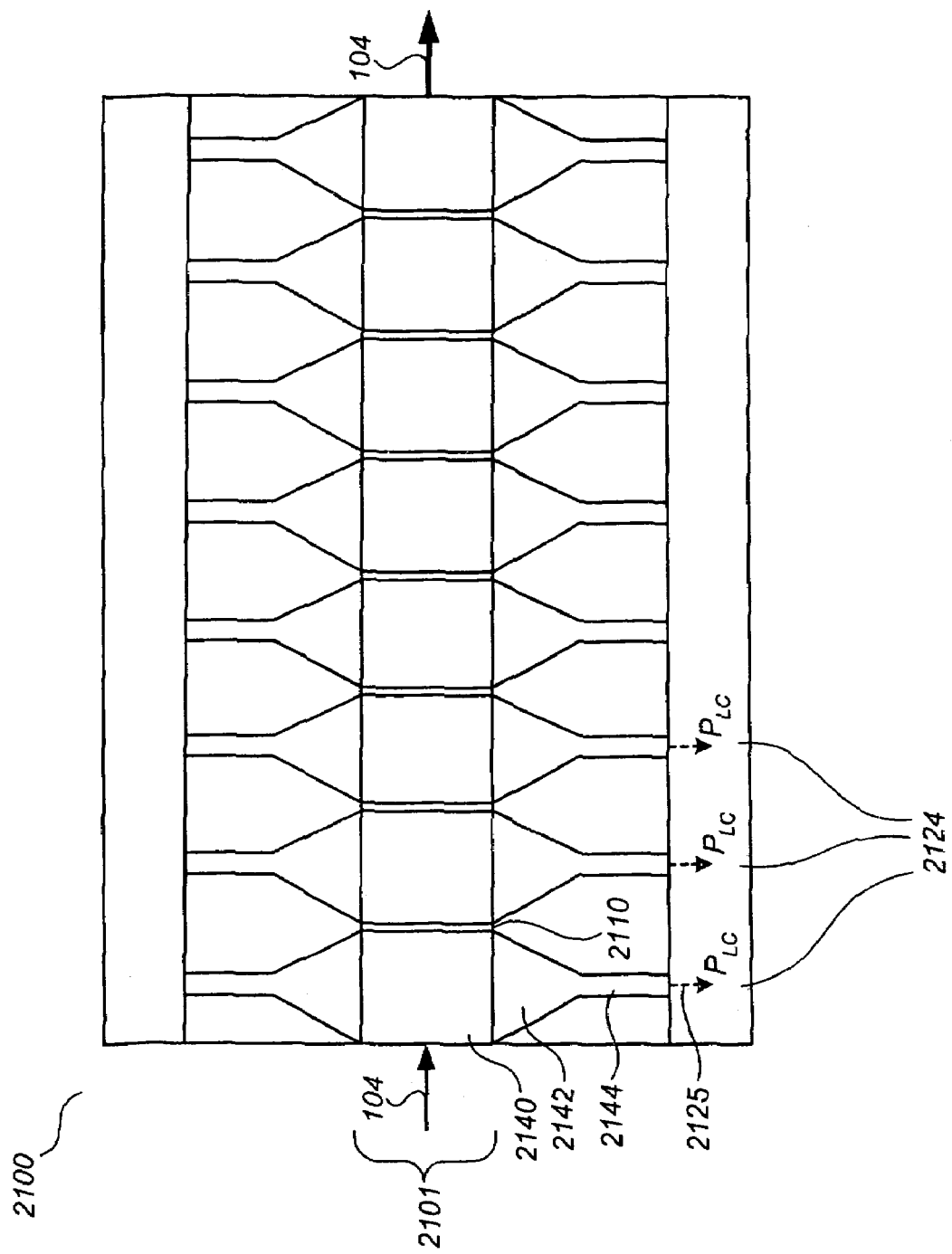
FIG. 21 illustrates a top view of an SOA in accordance with a preferred embodiment.

FIG. 21 illustrates a top view of an SOA 2100 in accordance with a preferred embodiment similar to the SOA 1900 of FIGS. 19A-19B except that the transverse laser cavities are tapered to reduce required pumping currents. SOA 2100 comprises a ridge element 2110 laterally defining a signal waveguide 2001, and a plurality of transverse laser cavities 2124. As indicated in FIG. 21, each of the transverse laser cavities 2124 comprises a central region 2140 that passes nearby the optical signal 104 and that evanescently provides signal amplification. The width of the central region 2140 should be a maximum because that width directly affects the amount of signal amplification. Each of the transverse laser cavities 2124 further comprises a transition region 2142 that tapers the width of the laser cavity down to a minimum width at an end region 2144. The tapers are effectuated by adjusting the shape of the ion implantation mask (see FIG. 18, steps 1812-1814) and the shape of the metallic electrical contacts during device fabrication. Electrical current requirements are reduced as compared to non-tapered laser cavities, because there is less volume of active gain medium that requires pumping.

Figure 23:
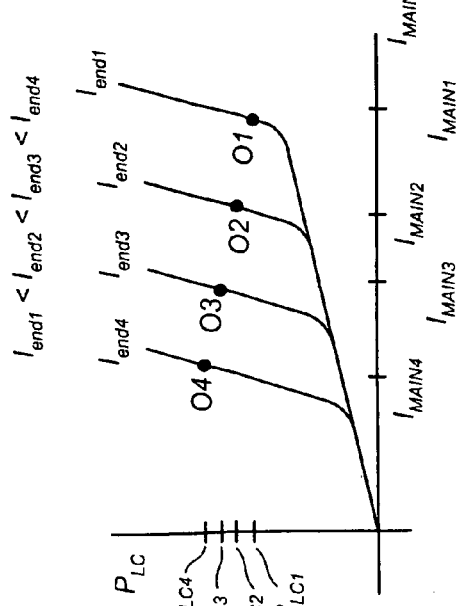
FIG. 23 illustrates a conceptual plot of emitted laser power versus excitation currents in the SOA of FIG. 22.
Figure 22:
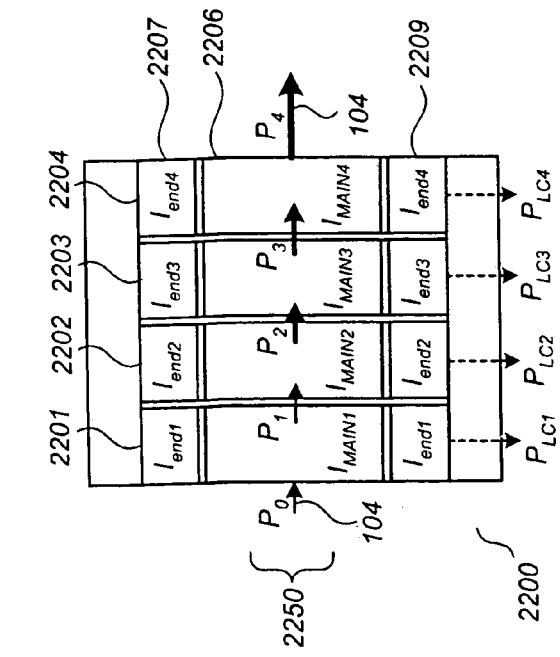
FIG. 22 illustrates a top view of an SOA in accordance with a preferred embodiment.
Figure 24A:
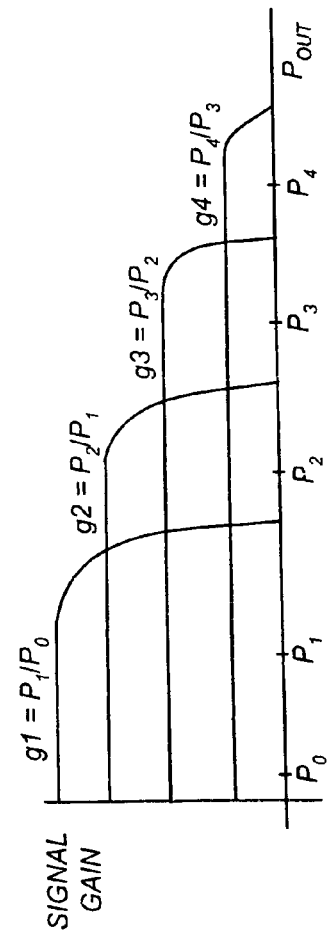
FIG. 24A illustrates a conceptual plot of signal gain versus signal power in the SOA of FIG. 22.
Figure 24B:
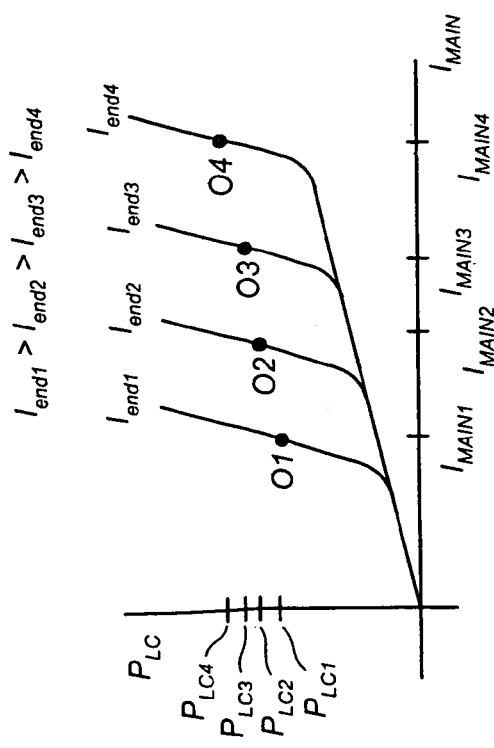
FIG. 24B illustrates a conceptual plot of emitted laser power versus excitation currents in the SOA of FIG. 22.
Figure 24C:
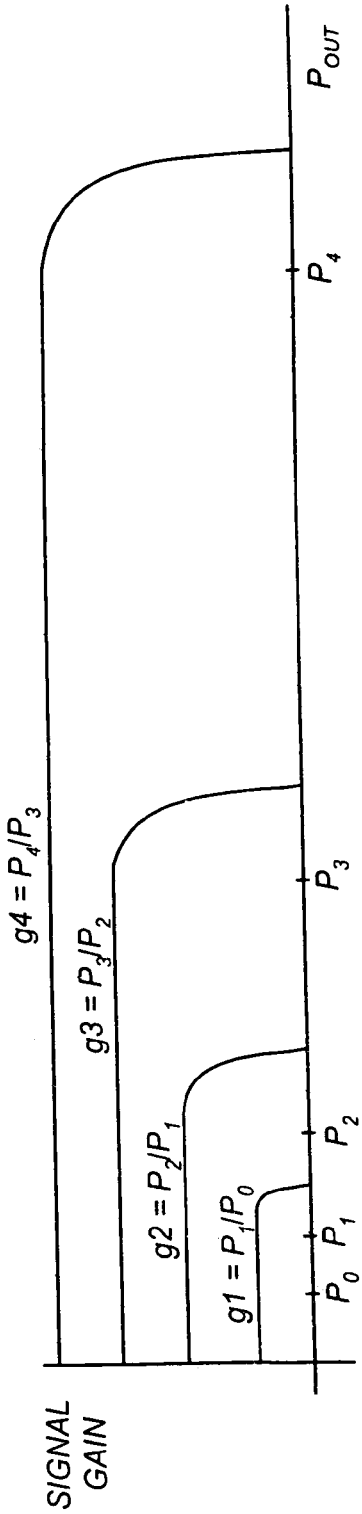
FIG. 24C illustrates a conceptual plot of signal gain versus signal power in the SOA of FIG. 22.

FIGS. 22-24C illustrate alternative schemes for varying the pumping currents among several multi-segment transverse lasers of an SOA according to a preferred embodiment, whereby ASE noise in the output is reduced. FIG. 22 illustrates a top view of an exemplary SOA used in describing the alternative schemes. FIGS. 23-24A illustrate operating parameters according to a first ASE reduction scheme, while FIGS. 24B-24C illustrate operating parameters according to a second ASE reduction scheme. The first ASE reduction scheme is operable when, for a given transverse laser cavity "x", there is a sublinear relationship between (i) spontaneous emission noise $N_x$ added to the optical signal, and (ii) signal gain $g_x$. By sublinear, it is meant that for a given percentage change in signal gain ($\Delta g_x/g_x$), there is a lesser percentage change in the spontaneous emission noise ($\Delta N_x/N_x$). The second ASE reduction scheme is operable when there is a superlinear relationship between $N_x$ and $g_x$, i.e., where a given percentage change in signal gain results in a greater percentage change in the spontaneous emission noise.

It is to be appreciated that, for simplicity and clarity of description, the SOA used in this example has only four transverse laser cavities. In practical devices there may be a substantially greater number of transverse laser cavities, or as few as two transverse laser cavities.

FIG. 22 illustrates a top view of an SOA 2200 similar to the SOA 2000 of FIG. 20 except having only four transverse laser cavities 2201, 2202, 2203, and 2204 that evanescently couple into a signal waveguide 2250 to amplify the optical signal 104. Each laser cavity comprises a main segment 2206 and end segments 2207 and 2209, respectively, each of the segments being separately pumped.

The notational scheme for FIGS. 22-24C is now described. Any given laser cavity in FIG. 22 is numbered 220x, where x=1, 2, 3, or 4. It will be presumed that the electrical currents supplied to the end portions 2207 and 2209 of any given laser cavity 200x are identical and represented by the single variable $I_{endx}$, it being understood that the scope of the preferred embodiments is not so limited. The main segment of each laser cavity 2004 is supplied with an electrical current $I_{MAINx}$. Each laser cavity 220x produces laser light having a power of $P_{LCx}$. For each laser cavity 200x, an incoming optical power $P_{x-1}$ encounters a corresponding portion of the signal waveguide 2250 and is amplified to produce an outgoing power $P_x$, resulting in a signal gain of $g_x=P_x/P_{x-1}$. The incoming power $P_0$ corresponding to the first laser cavity 2201 represents the optical signal 104 at the overall device input, while the outgoing power $P_4$ corresponding to the last laser cavity 2204 represents the optical signal 104 at the overall device output. According to a first preferred embodiment of an ASE reduction scheme operable when there is a sublinear relationship between spontaneous emission noise and signal gain, the end segments are provided with progressively increasing electrical currents, i.e., $I_{end1}<I_{end2}<I_{end3}<I_{end4}$, and each main segment is provided with an electrical current $I_{MAINx}$ sufficient to induce lasing action in a manner indicated in FIG. 23. FIG. 23 illustrates a conceptual plot of the laser cavity output power $P_{LCx}$ (which is itself unused) versus excitation current $I_{MAINx}$ according to the first ASE reduction scheme. The preferred operating points for the respective laser cavities are denoted by O1, O2, O3, and O4 in FIG. 23. FIG. 24 illustrates plots of signal gains g1, g2, g3, and g4 versus output power for each of the operating points O1, O2, O3, and O4, respectively. The first laser cavity 2201 yields the greatest gain magnitude and the lowest output saturation power. The second laser cavity 2202 yields a lesser gain magnitude and a higher output saturation power, and so on through laser cavity 2204, which yields the lowest gain magnitude but the highest output saturation power. The increases in output saturation power are concomitant with the need for such higher saturation powers, because the optical signal itself is getting large as it nears the SOA output. Where there is a sublinear relationship between spontaneous emission noise and signal gain, the scheme of FIGS. 23-24A will improve ASE performance as compared to a scenario in which all of the excitation currents and all of the gains of the transverse laser cavities 220x are kept the same.

According to a second preferred embodiment of an ASE reduction scheme operable when there is a superlinear relationship between spontaneous emission noise and signal gain, the end segments are provided with progressively decreasing electrical currents, i.e., $I_{end1}>I_{end2}>I_{end3}>I_{end4}$, and each main segment is provided with an electrical current $I_{MAINx}$ sufficient to induce lasing action in a manner indicated in FIG. 24B. FIG. 24B illustrates a conceptual plot of the laser cavity output power $P_{LCx}$ (which is itself unused) versus excitation current $I_{MAINx}$ according to the second ASE reduction scheme. The preferred operating points for the respective laser cavities are denoted by O1, O2, O3, and O4 in FIG. 24B. FIG. 24C illustrates plots of signal gains g1, g2, g3, and g4 versus output power for each of the operating points O1, O2, O3, and O4. The first laser cavity 2201 yields the lowest gain magnitude and the lowest output saturation power. The second laser cavity 2202 yields a greater gain magnitude and a higher output saturation power, and so on through laser cavity 2204, which yields the highest gain magnitude and the highest output saturation power. The increases in output saturation power are concomitant with the need for such higher saturation powers, because the optical signal itself is getting large as it nears the SOA output. Where there is a superlinear relationship between spontaneous emission noise and signal gain the scheme of FIGS. 24B-24C will improve ASE performance as compared to a scenario in which all of the excitation currents and all of the gains of the transverse laser cavities 220x are kept the same.

It is to be appreciated that while electrical pumping currents of identical laser cavities are used to reduce ASE noise in the example of FIGS. 22-24C, other variations among the laser cavities may be used that achieve equivalent effects. For example, the individual or combined variations among successive laser cavities described supra with respect to FIG. 17, which include excitation current magnitudes, end mirror reflectivities, gain medium materials, gain medium thicknesses, cavity dimensions, and optical injection densities can be varied to achieve ASE reduction and/or other useful results according to the preferred embodiments. In each case, the gain and the saturation power are varied along successive longitudinal portions of the optical signal path to improve SOA performance as compared to configurations in which the gain and the saturation power remain uniform along successive longitudinal portions. Whether used separately or in combination with electrical current variations, such methods for reducing output noise in an SOA having a plurality of laser cavities that provide energy for amplification of the optical signal are within the scope of the preferred embodiments. By way of further example, within the scope of the preferred embodiments is an SOA having the combined attributes of the embodiment of FIG. 20 and FIG. 22 to provide varied gain, gain clamped, and gain-unclamped operation for signal processing. It is to be further appreciated that these structures and methods for reducing ASE noise or achieving other desired effects are also advantageously applied to preferred embodiments in which the gain medium of the laser cavities is coextensive with the gain medium of the signal waveguide, as described in Ser. No. 09/972,146, supra.

Figure 25:
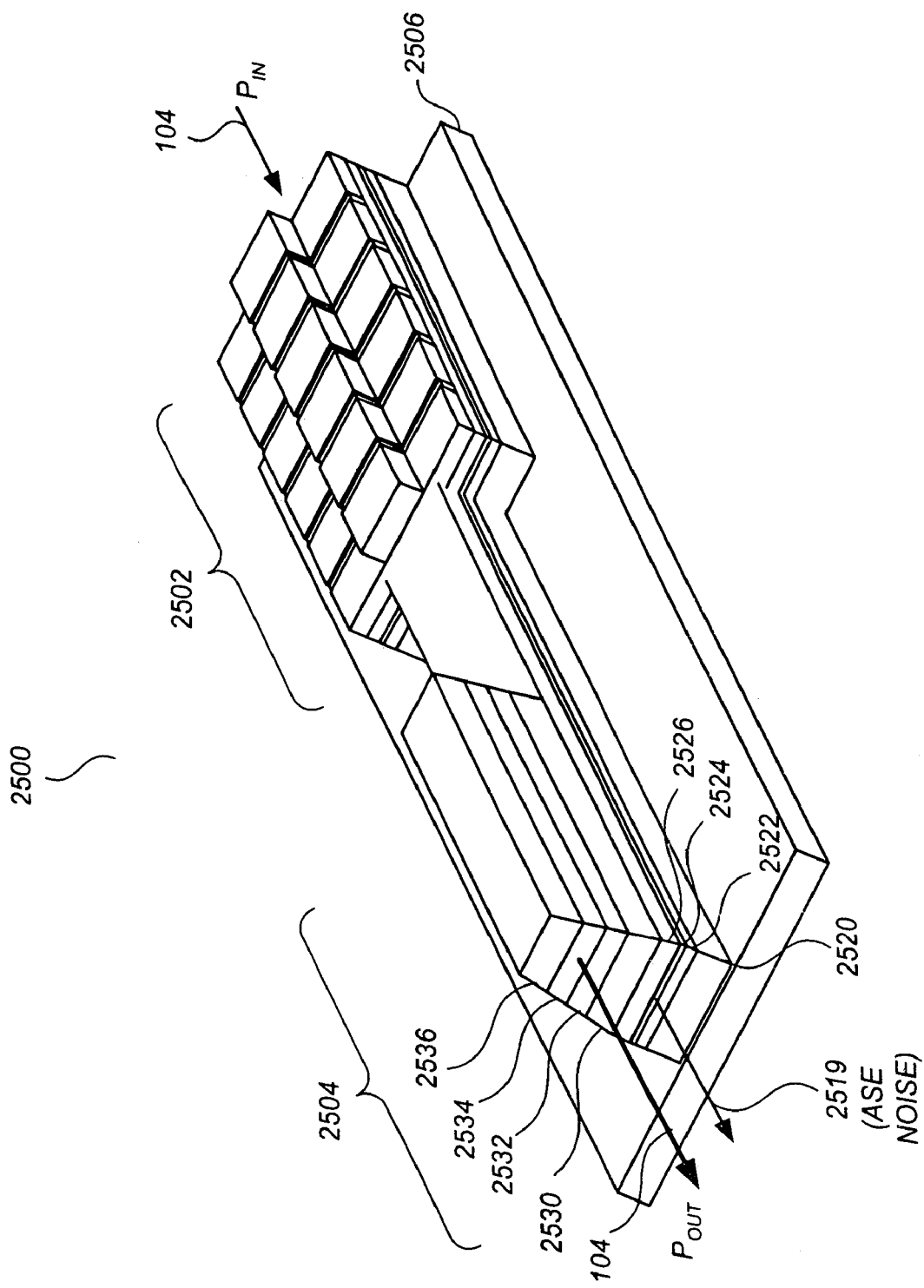
FIG. 25 illustrates a perspective view of an SOA with an integrated tunable vertical coupler filter in accordance with a preferred embodiment.

FIG. 25 illustrates a perspective view of an integrated optical amplifier 2500 in accordance with a preferred embodiment, comprising an SOA 2502 having multiple transverse laser cavities, and comprising a tunable vertical coupler filter 2504 integrated therewith on a common substrate 2506. The SOA 2502 is similar to one described in Ser. No. 09/972,146, supra, in which the gain medium of the laser cavities is coextensive with the gain medium of the signal waveguide. It is to be appreciated, however, that the SOAs described herein, in which the laser gain medium is evanescently coupled with the optical signal, may be used as well. While having a variety of uses, the integrated optical amplifier 2500 is particularly useful as a power amplifier or line amplifier in wavelength division multiplexed (WDM) communications applications. The integrated optical amplifier 2500 receives an optical signal 104 which is amplified by the SOA 2502 and filtered by the tunable vertical coupler filter 2504, which results in an amplified version of the optical signal 104 as well as an unused ASE noise output 2519 spatially separated therefrom.

The tunable vertical coupler filter 2504 shares cladding layers 2522 and 2526 with the SOA 2502, and further comprises an input signal guiding layer 2524 which may be a disordered extension of the gain medium layer of the SOA 2502, or which may comprise a different wave guiding material. The tunable vertical coupler filter 2504 may be similar to any of those described in Liu et. al., "Optical Add/Drop Multiplexers Based on X-Crossing Vertical Coupler Filters," IEEE Photonics Technology Letters, Vol. 12, No. 4 (April 2000), which is incorporated by reference herein. The tunable vertical coupler filter 2504 comprises a coupling layer 2530, a guiding layer 2532, an upper cladding layer 2534, and a contact layer 2536, and is broadly tunable by current injection or the application of an appropriate bias voltage.

Figure 26:
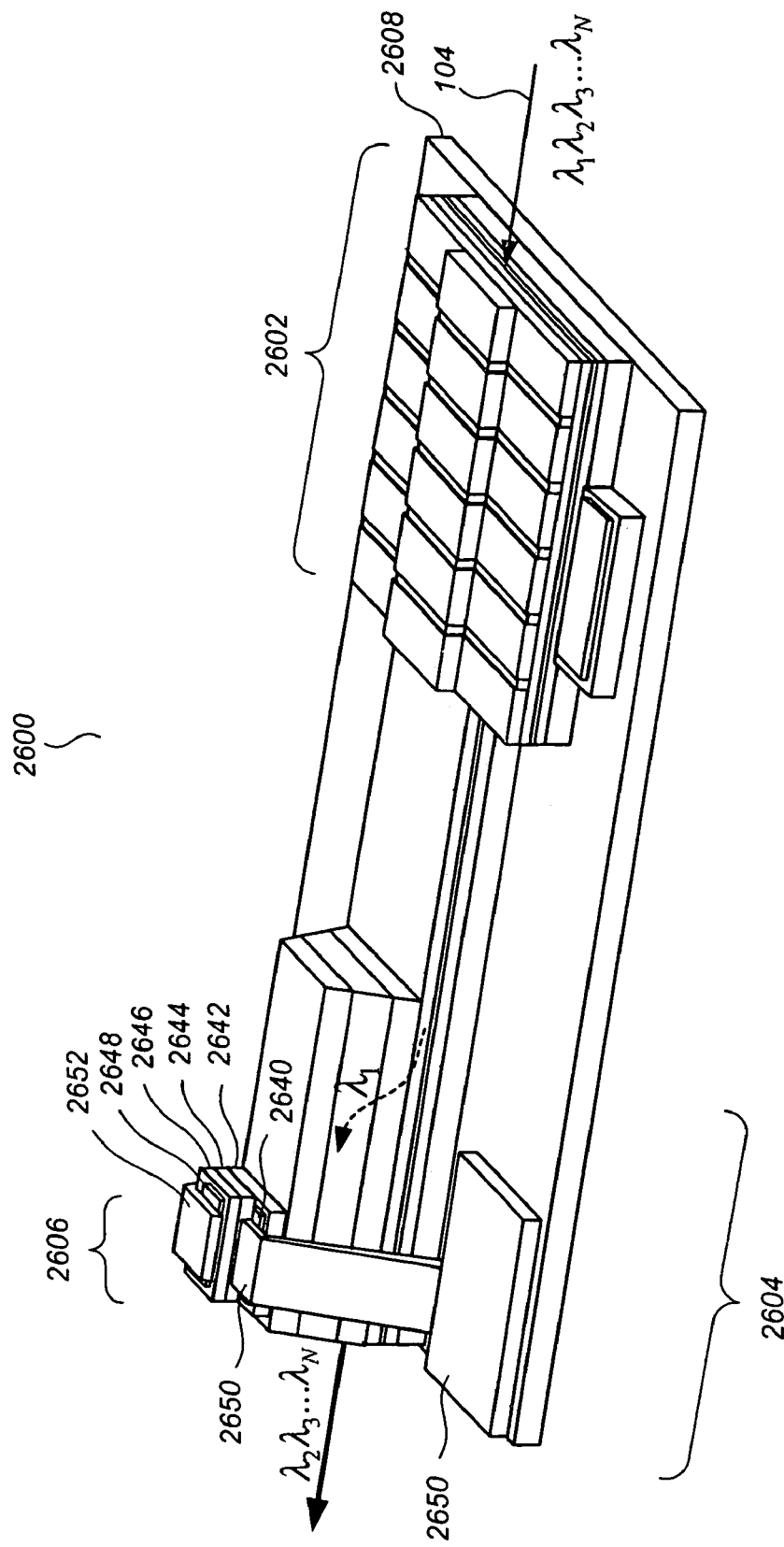
FIG. 26 illustrates a perspective view of an SOA with an integrated tunable vertical coupler filter and integrated photodiode detector in accordance with a preferred embodiment.

FIG. 26 illustrates a perspective view of an optical detector 2600 having an integrated amplifier in accordance with a preferred embodiment. Optical detector 2600 comprises an SOA 2602 similar to the SOA 2502 of FIG. 25 integrated onto a common substrate 2608 with a tunable vertical coupler filter 2604 tuned to a wavelength $\lambda_1$, which in turn comprises a photodetector 2606 integrated therewith. Photodetector 2606 comprises a lower p-doped cladding layer 2642, an i-absorbing layer 2644, an upper n-doped cladding layer 2646, and lower and upper ohmic contacts 2640 and 2648, respectively. In operation, an optical signal 104 comprising an N-channel WDM signal having channels at $\lambda_1 \lambda_2 \lambda_3 \ldots \lambda_N$ is input to the SOA 2602, where it is amplified. At the tunable vertical coupler filter 2604, the channel at $\lambda_1$ gets removed and fed to photodetector 2606, where it is absorbed by the i-absorbing layer 2644. An electrical voltage proportional to the optical signal intensity of the $\lambda_1$ channel is output between contacts 2650 and 2652. Meanwhile, the remaining channels at $\lambda_2 \lambda_3 \ldots \lambda_N$ pass through in amplified form. It should be appreciated that FIG. 26 is not necessarily to scale.

Figure 27:
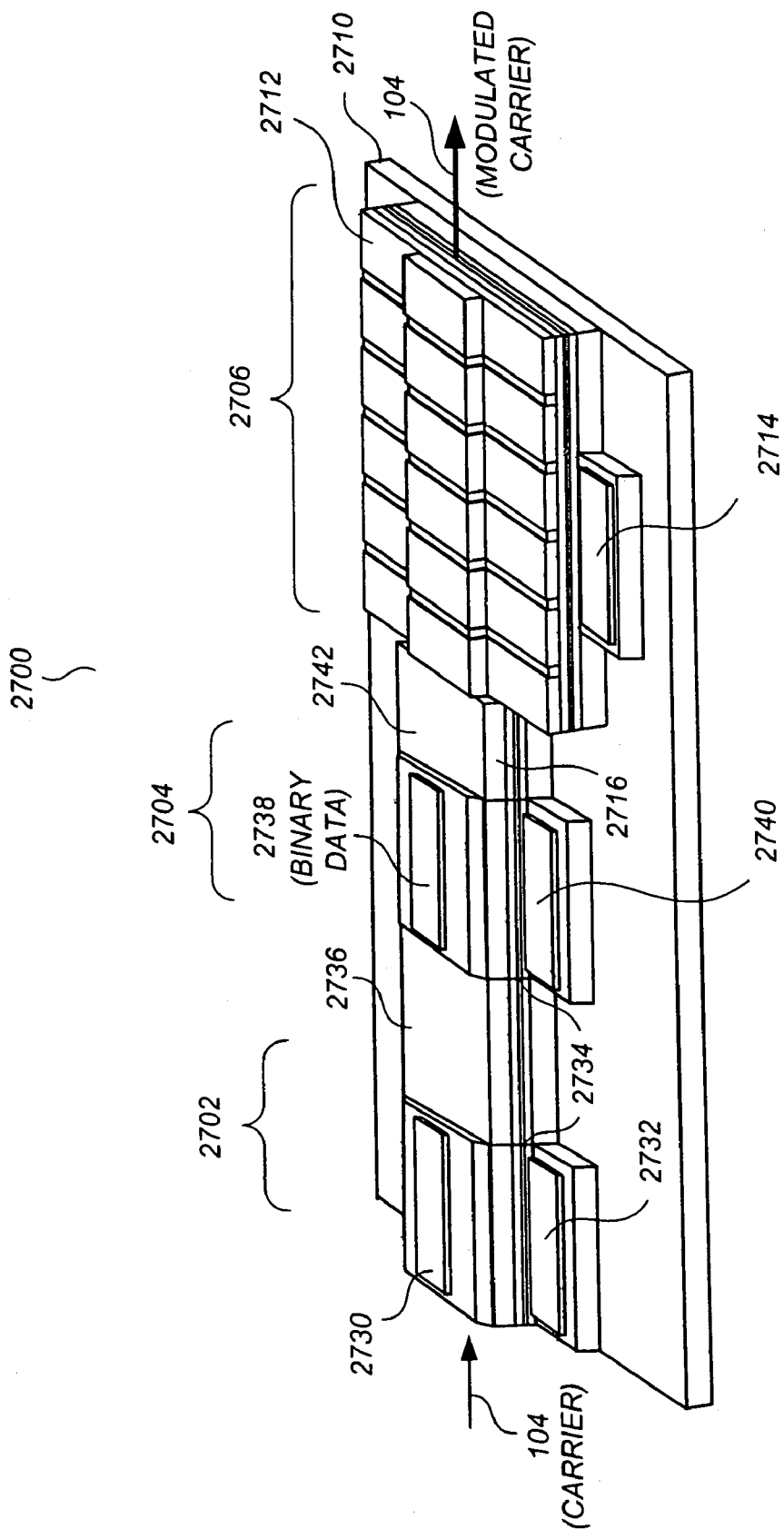
FIG. 27 illustrates a perspective view of an integrated return-to-zero (RZ) signal generator in accordance with a preferred embodiment.

FIG. 27 illustrates a perspective view of an optical return-to-zero (RZ) source 2700 having an integrated power amplifier in accordance with a preferred embodiment. RZ source 2700 comprises a first electro-absorption (EA) modulator 2702, a second EA modulator 2704, and an SOA 2706 having multiple transverse laser cavities, all three devices being integrated onto a common substrate 2710. The SOA 2706 is similar to a preferred embodiment of Ser. No. 09/972,146, supra, in which the gain medium of the laser cavities is coextensive with the gain medium of the signal waveguide. It is to be appreciated, however, that the SOAs described herein, in which the laser gain medium is evanescently coupled with the optical signal, may be used as well. In general, the layers of the phase modulators 2702 and 2704 are extensions of the layers of the SOA 2706, except that EA modulating material 2734 must be provided instead of the gain medium layers between the electrical contacts (2730/2732 and 2738/2740, respectively) of the EA modulators 2702 and 2704. An additional cladding layer 2716 is provided in each EA modulator, as shown in FIG. 27. The SOA 2706 comprises upper electrical contacts 2712 and a lower electrical contact 2714. Importantly, all layers of the intermediate regions 2736 and 2742 should be electrically nonconductive to provide electrical isolation among the elements, either by use of inherently nonconductive materials or otherwise by proton implantation or other electrical passivation method.

In operation, the RZ source 2700 receives (i) an optical carrier signal 104, (ii) a binary data signal at a modulation rate M at the electrical inputs 2738/2740 of the second EA modulator, and (iii) a sinusoidal signal at frequency M at the electrical inputs 2730/2732 of the first EA modulator. An RZ-modulated data signal is output from the second EA modulator 2704, and is then amplified prior to transmission by the SOA 2706 to produce an amplified, modulated optical carrier.

Mathematically, the operation of the RZ source 2700 is similar to that described in Ougazzaden, A. et. al., "40 Gb/s Tandem Electro-Absorption Modulator," Optical Fiber Communication Conference and Exhibit, pp. PD14-1 to PD14-3, Optical Society of America, Anaheim, Calif. (Mar. 17-22, 2001), which is incorporated by reference herein, whereby the first EA modulator 2702 operates like the Ougazzaden "carver" and the second EA modulator 2704 operates like the Ougazzaden "encoder". From a practical viewpoint, however, the RZ source 2700 has an advantage over the structure described in Ougazzaden, which integrates a conventional SOA inbetween the EA modulators. This is presumably done because the conventional SOA experiences data-dependent gain fluctuations, and so it could not be placed after the second ("encoder") EA modulator because the encoded data is an unpredictable bit stream. Because the output of the first ("carver") EA modulator is a regular pattern, the data-dependent gain of the conventional SOA used in Ougazzaden can be tolerated and/or compensated. Disadvantageously, however, amplification of the optical signal prior to the "encoder" EA modulator can cause a bleaching effect in that EA modulator, and therefore device performance is degraded. In contrast, because the SOA 2700 of FIG. 27 is gain-clamped and does not experience data-dependent gain fluctuations, it can be placed after the second EA modulator 2704 and the bleaching effects of Ougazzaden are avoided.

Figure 28:
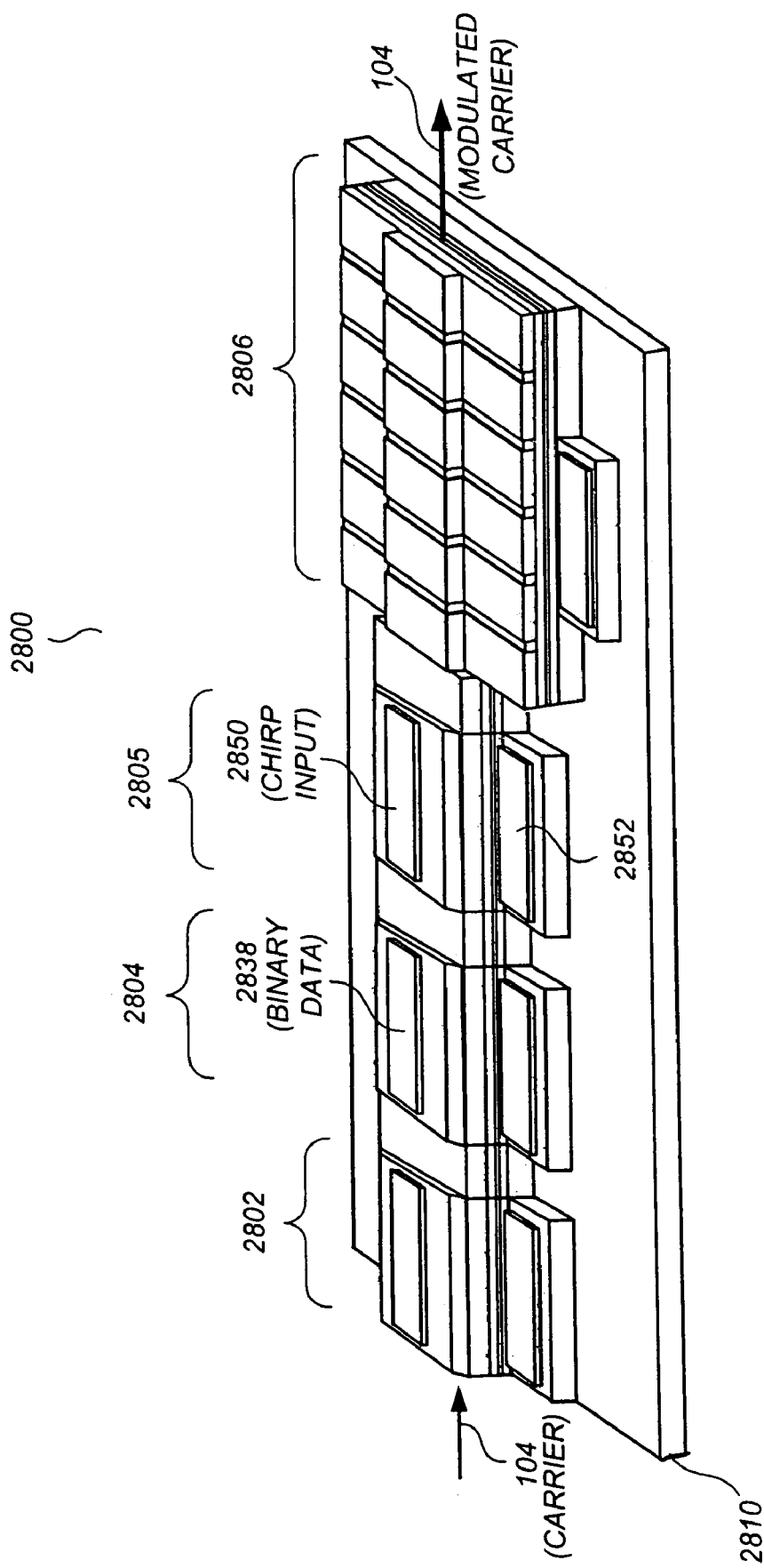
FIG. 28 illustrates a perspective view of an integrated return-to-zero (RZ) signal generator with chirp tailoring capability in accordance with a preferred embodiment.

FIG. 28 illustrates a perspective view of an optical return-to-zero (RZ) source 2800 having an integrated power amplifier and chirp induction/compensation in accordance with a preferred embodiment. RZ source 2800 is similar to the RZ source 2700, comprising a first EA modulator 2802, a second EA modulator 2804, and an SOA 2806 similar to elements 2702, 2704, and 2706 of FIG. 27, respectively, integrated onto a common substrate 2810. However, a phase modulating element 2805 is inserted between the second EA modulator 2804 and the SOA 2806, which induces a chirp in the modulated signal responsive to a voltage signal provided at electrical contacts 2850/2852 thereof. Chirp compensation can be provided, and/or additional chirp can be provided, which can be useful in certain dispersion compensating scenarios.

Figure 29:
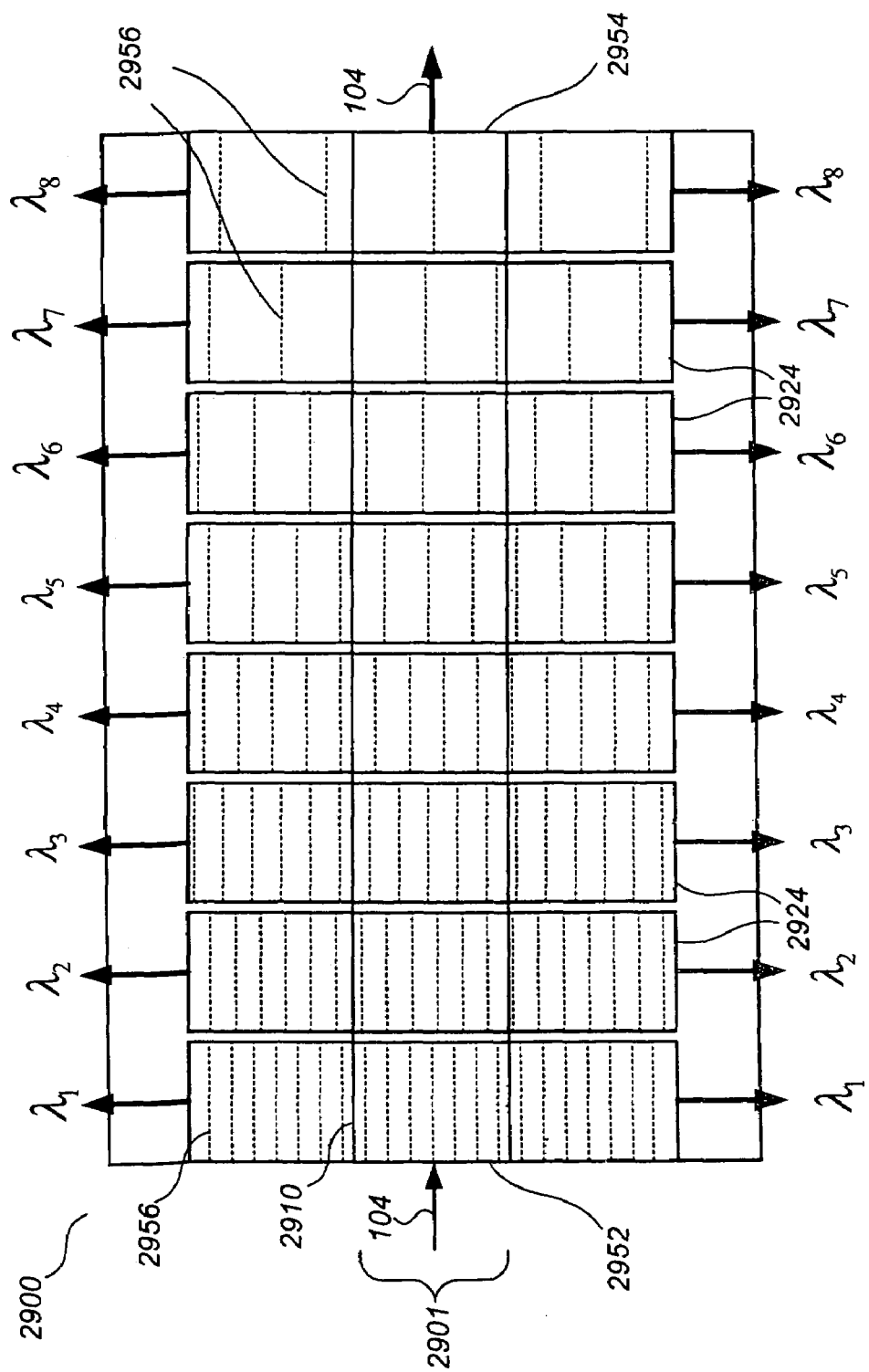
FIG. 29 illustrates a top view of an SOA in accordance with a preferred embodiment.

FIG. 29 illustrates a simplified top view of an SOA 2900 in accordance with a preferred embodiment. SOA 2900 that is similar to the SOA 1900 of FIGS. 19A-19B except that it has an added feature in which successive transverse laser cavities comprise DFB gratings with different grating periods to avoid optical coupling effects among them. SOA 2900 comprises a signal waveguide 2901 with lateral confinement provided by a ridge element 2910 and a plurality of transverse laser cavities 2924, the lasing fields providing amplification energy for an optical signal 104 propagating down the signal waveguide 2901 between an input 2952 and an output 2954.

As discussed supra with respect to FIG. 9, injection locking effects can become problematic if the power of the optical signal 104 near the output 2954 approaches the order of magnitude of the power of the transverse laser cavity nearest the output. If there is strong optical coupling among adjacent transverse laser cavities, the adverse effects of the injection locking can ripple backward from the last transverse laser to previous transverse laser. According to a preferred embodiment, the transverse laser cavities 2924 comprise DFB gratings 2956 of different periods such that lasing action occurs at different wavelengths $\lambda_1, \lambda_2, \ldots \lambda_N$ that are sufficiently spaced apart in wavelength such that optical coupling effects among the transverse laser cavities 2924 is avoided. Accordingly, the SOA 2900 is robust against adverse injection locking effects. DBR gratings of differing periods may also be used to achieve differing lasing wavelengths. Each of the wavelengths $\lambda_1, \lambda_2, \ldots \lambda_N$ should lie within in the lasing range 906 of FIG. 9, supra.

One advantage from a practical viewpoint is that substantial tolerances exist between the intended set of wavelengths $\lambda_1, \lambda_2, \ldots \lambda_N$ and the actual real-world wavelengths at which the transverse laser cavities 2924 actually operate. The important criterion is that they simply operate at different wavelengths. The actual operating wavelengths do not need high precision as long as they fall within the lasing range 906 of FIG. 9.

It is to be appreciated that any of a variety of structure and/or composition variations among the different transverse laser cavities 2924 may be employed to counter injection locking effects in accordance with the preferred embodiments. For example, different material compositions for the gain media can be used to achieve lasing action at different wavelengths $\lambda_1, \lambda_2, \ldots \lambda_N$. As another example, one or more of the transverse laser cavities 2924 may comprise a coupled-cavity laser pair. Strongly monochromatic behavior at a predetermined single lasing wavelength $\lambda_i$ is achieved for each coupled-cavity laser pair. For a given laser pair, the signal waveguide 2901 only passes near one of the two lasers. The two lasers are coupled together via a small gap that is achieved by etching or cleaving. When the gap is achieved by cleaving, the lasers are commonly called cleaved coupled cavity lasers. The lasing wavelength for the coupled-cavity laser pair is the wavelength(s) at which their individual longitudinal modes overlap. According to a preferred embodiment, each of the laser cavities has a longitudinal mode at the desired lasing wavelength $\lambda_i$, the wavelength $\lambda_i$ lying in the lasing range 906 of FIG. 9, and the lengths of the laser cavities are similar but not identical. The coupled-cavity pair thereby lases at the desired lasing wavelength $\lambda_i$ in a strongly monochromatic manner, because the next permitted longitudinal mode is separated from $\lambda_i$ by an amount that is substantially greater than the longitudinal mode spacing of either of the individual laser cavities when viewed in isolation. By proper selection of individual cavity lengths and other characteristics, the lasing wavelengths of the successive coupled-cavity laser pairs are controlled such that operation is achieved at different wavelengths $\lambda_1, \lambda_2, \ldots \lambda_N$, respectively, thereby avoiding injection locking effects. In other preferred embodiments, the lengths of the coupled-cavity laser pair may be substantially asymmetric. The SOA 2900 may comprise laser cavities that are in accordance with Wiedmann et. al., "Singlemode Operation Of Deeply Etched Coupled Cavity Laser With DBR Facet," Electronics Letters, Vol. 36, No. 14 (Jul. 6, 2000), which is incorporated by reference herein.

Figure 30:
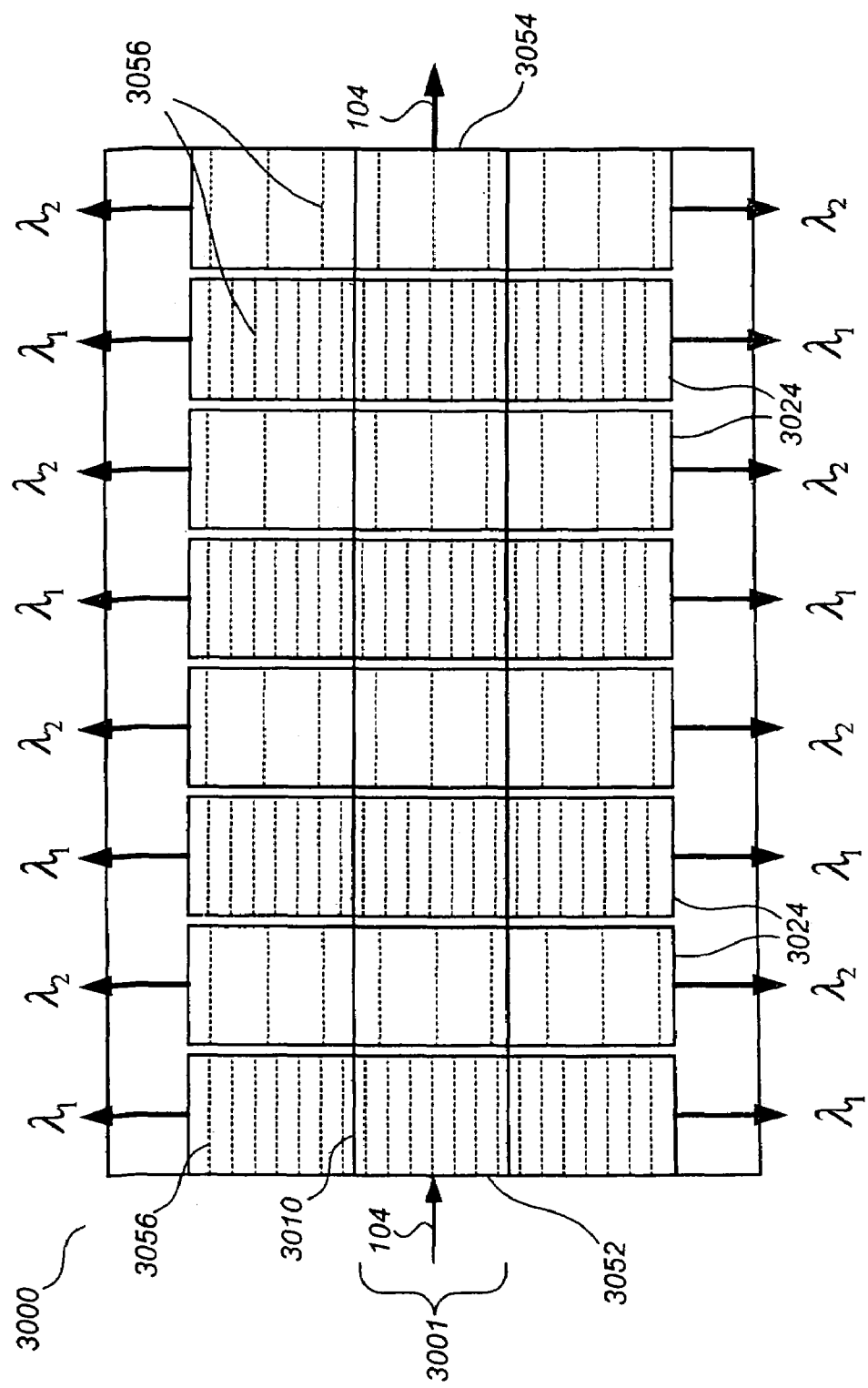
FIG. 30 illustrates a top view of an SOA in accordance with a preferred embodiment.

FIG. 30 illustrates a simplified top view of an SOA 3000 in accordance with a referred embodiment that is similar to the SOA 2900 of FIG. 29 except that the lasing wavelengths alternate between only two wavelengths $\lambda_1$ and $\lambda_2$. A primary advantage of the SOA 3000 over the SOA 2900 of FIG. 29 relates to ease of fabrication, as the same two grating patterns can repeat. Because optical coupling between two laser cavities decreases substantially with increased spacing, the amount of optical coupling among transverse lasers having the wavelength $\lambda_1$ is very small, and the amount of optical coupling among transverse lasers having the wavelength $\lambda_2$ is very small.

Figure 31:
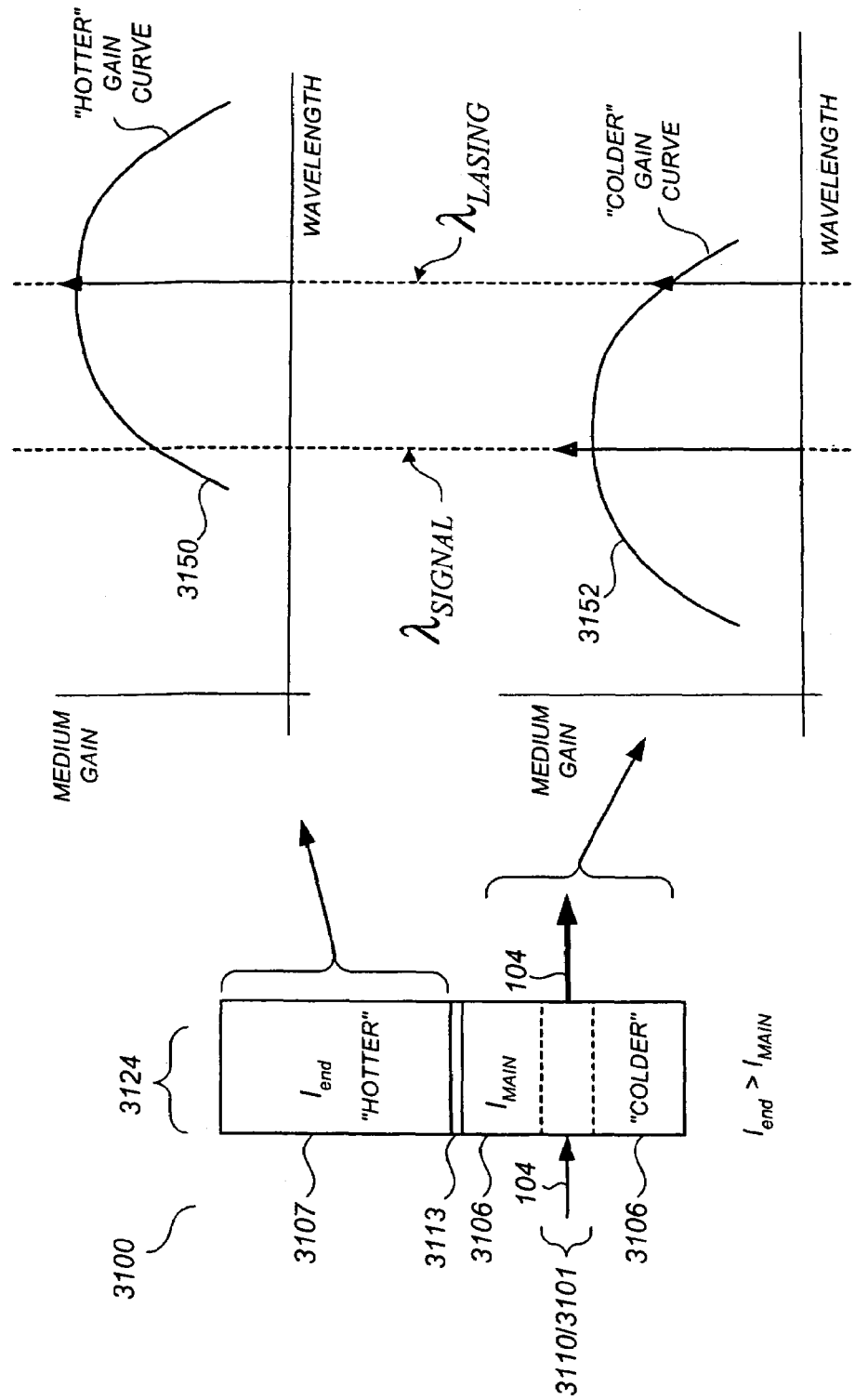
FIG. 31 illustrates a top view of an SOA in accordance with a preferred embodiment and related explanatory gain medium characteristic curves.

FIG. 31 illustrates a top view of an SOA 3100 in accordance with a preferred embodiment and related explanatory gain medium characteristic curves. SOA 3100 comprises an overall structure similar to that of the SOA 1900 of FIGS. 19A-19B, but is further adapted to take advantage of thermal shifts in the gain medium characteristic in order to increase efficiency. SOA 3100 comprises a transverse laser cavity 3124 divided into two separately excited segments 3106 and 3107 by an isolation region 3113, the isolation region 3113 being proton-implanted to provide electrical isolation, the gain medium of the isolation region 3113 being disordered to provide optical continuity in the transverse laser cavity 3124. Alternatively, the gain medium is left ordered in the isolation region 3113, and the electrical resistivity profile is tailored such that a modest amount of excitation current sufficient to pump the gain medium to transparency is supplied. For simplicity and clarity of explanation, only a single transverse laser cavity is shown, it being understood that there can be multiple transverse laser cavities. A ridge element 3110, shown in dotted lines instead of solid lines so that the bounds of laser segment 3106 are clear, provides lateral confinement for the optical signal 104 as it propagates down a signal waveguide 3101. The signal waveguide 3101 is in a plane separate from the gain medium layer. In an alternative preferred embodiment, the signal waveguide 3101 is coextensive with the gain medium layer, as described in Ser. No. 09/972,146, supra. The laser segment 3106 passing near the signal waveguide 3101 is pumped with a current $I_{MAIN}$, while the other laser segment 3107 is pumped with a current $I_{end}$.

According to a preferred embodiment, the pump current $I_{end}$ is made greater (or lesser) than the pump current $I_{MAIN}$ by an amount sufficient to raise (or lower) the junction temperature in the laser segment 3107 above (or below) the junction temperature in the laser segment 3106. As indicated by the gain medium characteristic curves 3150 and 3152, the different junction temperatures cause a shift in the gain curves. As known in the art, the amount of shift is roughly 1 nm per degree Celsius. The curves are shifted such that the gain curve 3150 of the gain medium of the laser segment 3107 peaks closer to the lasing wavelength $\lambda_{LASING}$ (i.e., closer to the lasing range 906 of FIG. 9), while the gain curve 3152 of the gain medium of the main laser segment 3106 peaks closer to the signal wavelength $\lambda_{LASING}$. Operational efficiency of the SOA 3100 is thereby increased.

In an alternative preferred embodiment, equivalent efficiency increases can be realized by altering other aspects of the laser segments 3106 and 3107 to achieve relative shifts in their gain medium characteristic curves. In one example, the gain medium characteristic curves are adjusted differently for the two sections using oxide preferential growth.

Figure 32:
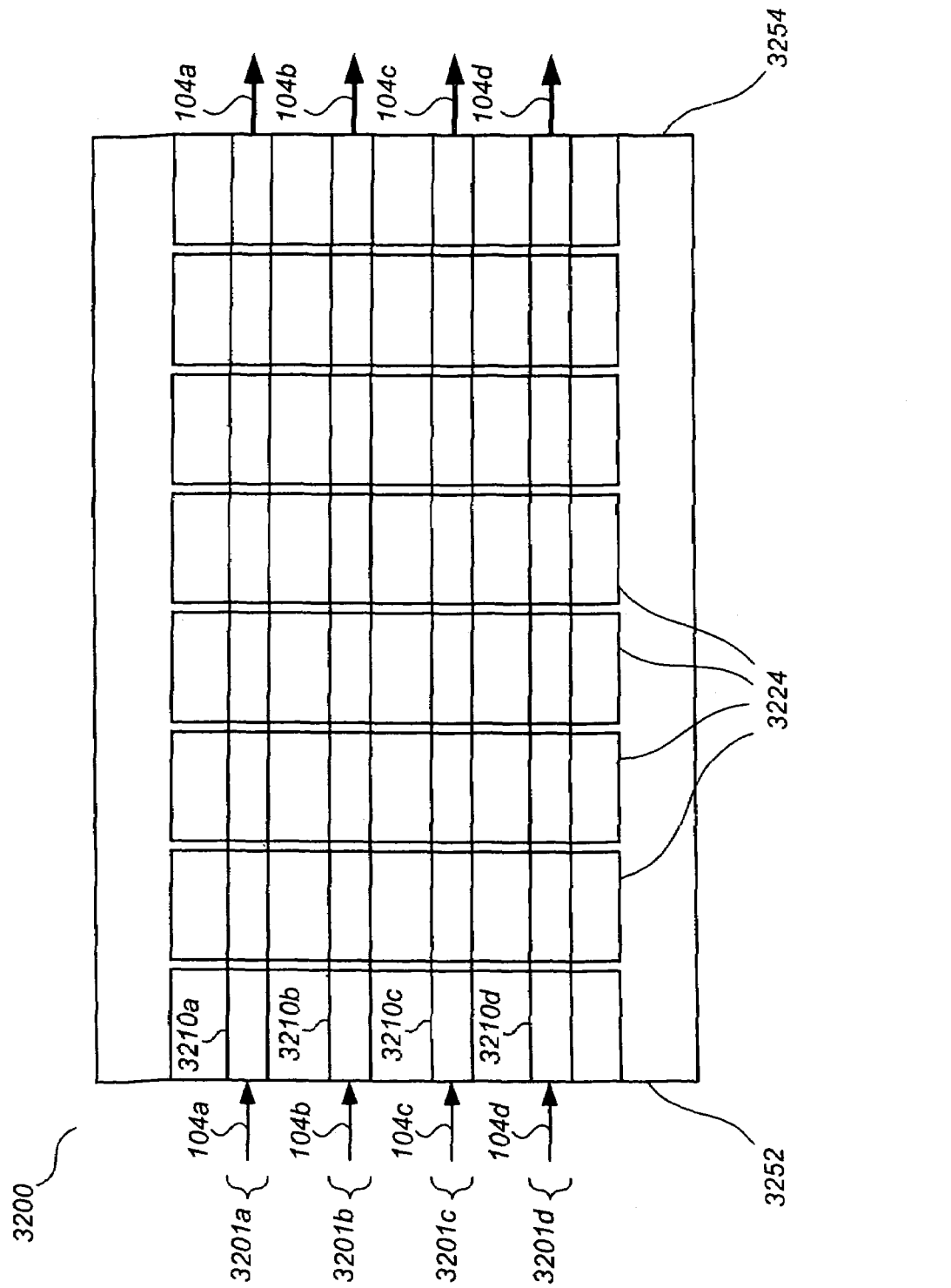
FIG. 32 illustrates a top view of an SOA array in accordance with a preferred embodiment.

FIG. 32 illustrates a top view of an SOA array 3200 in accordance with a preferred embodiment. SOA 3200 comprises an overall structure similar to that of the SOA 1900 of FIGS. 19A-19B, except that a plurality of signal waveguides 3201*a*-3201*d* share the same set of transverse laser cavities 3224. This is achieved by forming multiple ridge elements 3210*a*-3210*d* as indicated in FIG. 32. A plurality of optical signals 104*a*-104*d* are amplified as they pass from an input facet 3252 to an output facet 3254. The respective optical signals 104*a*-104*d* are amplified by about the same factor. The transverse laser cavities 3224 operate as "ballast" energy sources for gain-clamped amplification of the optical signals 104*a*-104*d*, and can be referred to as transverse "ballast" lasers. For the embodiment of FIG. 32 and other preferred embodiments, the spectrum of the gain medium is preferably broadened using multiple quantum wells of slightly different compositions among the different transverse lasers to achieve wider overall operating ranges. The signal waveguides 3201*a*-3201*d* are in a plane separate from the plane of the gain medium layer. In an alternative preferred embodiment, the signal waveguides 3201*a*-3201*d* are coextensive with the gain medium layer, as described in Ser. No. 09/972,146, supra. The SOA 3200 integrates well with planar lightwave circuits and is well suited for a variety of devices in which high-density SOA arrays could be useful, e.g., optical switches, optical signal processors, array waveguides, and other devices.

Figure 33:
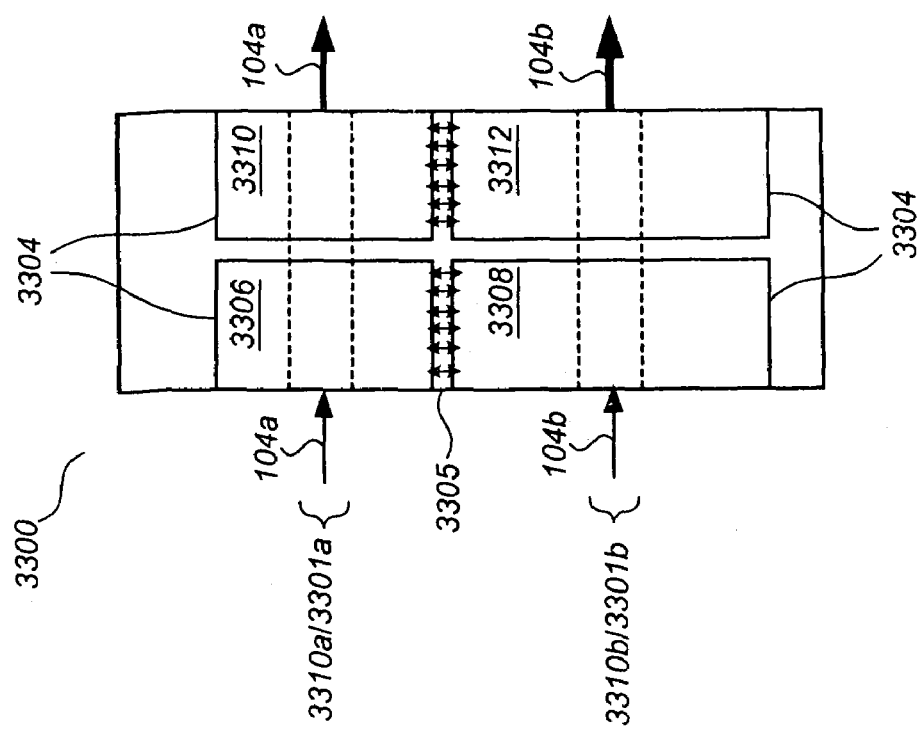
FIG. 33 illustrates a top view of an SOA array in accordance with a preferred embodiment.

FIG. 33 illustrates a top view of an SOA array 3300 in accordance with a preferred embodiment in which the "ballast" lasers are successive pairs of coupled-cavity lasers. In the example of FIG. 33 there are two coupled-cavity pairs 3306/3308 and 3310/3312, although in general there can be any number of them. A trench 3305, filled with air or other material that provides sufficient refractive index differences, forms one facet of each laser, the opposite facets being shown as elements 3304 in FIG. 33. Signal waveguides 3301*a*-3301*b* are laterally defined by ridge elements 3310*a*-3310*b*, respectively, the ridge elements being shown in dotted lines instead of solid lines so that the bounds of lasers are clear. As known in the art, each member of a coupled-cavity laser pair operates as a distinct laser cavity with its own pump current, gain, carrier densities, resonance conditions, and so forth, although their operating wavelength is the same. Advantageously, in the SOA 3300 the optical signals 104*a*-104*b* can be amplified by different amounts as a function of different pump currents applied to the coupled-cavity laser pairs. The signal waveguides 3301*a*-3301*b* are in a plane separate from the plane of the gain medium layer. In an alternative preferred embodiment, the signal waveguides 3301*a*-3301*b* are coextensive with the gain medium layer, as described in Ser. No. 09/972,146, supra.

Figure 34:
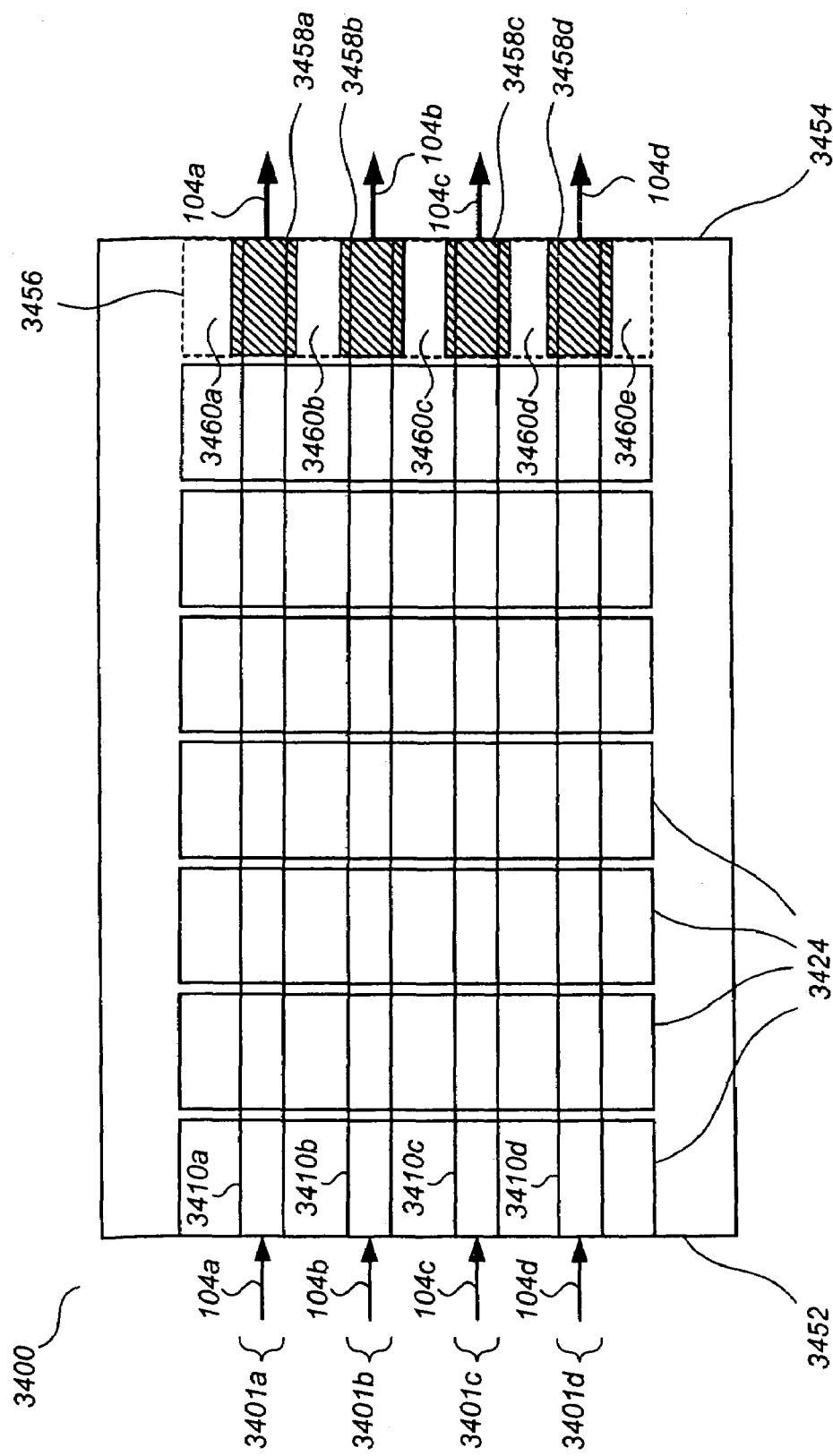
FIG. 34 illustrates a top view of an SOA array in accordance with a preferred embodiment.

FIG. 34 illustrates a top view of an SOA array 3400 in accordance with a preferred embodiment that also provides different amplifications for different optical signals. SOA 3400 comprises an overall structure similar to that of the SOA 3200 of FIG. 32, comprising a plurality of transverse laser cavities 3424 and multiple ridge elements 3410*a*-3410*d* forming multiple signal waveguides 3401*a*-3401*d* guiding a plurality of optical signals 104*a*-104*d* that are amplified as they pass from an input facet 3452 to an output facet 3454. However, for a final transverse cavity 3456 there are separate electrical contacts 3458*a*-3458*d* for each respective signal waveguide 3401*a*-3401*d*, with proton-implanted isolation zones 3460*a*-3460*e* being formed therearound. The gain medium layer is left intact (i.e., not disordered) in the isolation zones 3460*a*-3460*e* so that lasing cannot build up under any circumstance. The areas under the respective electrical contacts 3458*a*-3458*d* are pumped below transparency with different amounts of current so that each serves as its own variable attenuator. Accordingly, the optical signals 104*a*-104*d* can be amplified by different, tunable amounts as they pass through the SOA array 3400. The signal waveguides 3401*a*-3401*d* are in a plane separate from the plane of the gain medium layer. In an alternative preferred embodiment, the signal waveguides 3401*a*-3401*d* are coextensive with the gain medium layer, as described in Ser. No. 09/972,146, supra.

Whereas many alterations and modifications of the present invention will no doubt become apparent to a person of ordinary skill in the art after having read the foregoing description, it is to be understood that the particular embodiments shown and described by way of illustration are in no way intended to be considered limiting. For example, while the laser cavities described in the preferred embodiments supra are index-guided using a rib element for lateral confinement, in other preferred embodiments the lateral confinement may be provided by epitaxially regrown material adjacent to the active medium. In such case, the gain medium is grown across the entire lateral extent of the device and then etched away at locations other than the laser cavity strip, and a non-active material having an index of refraction less than that of the gain medium is epitaxially regrown adjacent to the gain medium strip. In still other preferred embodiments, the laser cavities are gain-guided. As another example, while current confinement described in the preferred embodiments supra was achieved by proton implantation, in other preferred embodiments current confinement may be achieved by p-n blocking, Fe doping, or other methods.

By way of further example, although the preferred embodiments are described supra in terms of electrical pumping of the laser gain medium, the scope of the preferred embodiments is not so limited. The gain medium may alternatively be optically pumped, wherein a light flux is introduced into the gain medium to achieve a population inversion. There are also other known methods that may be used for pumping, including chemical pumping where the population is achieved chemically, and other methods. As yet another example, although the preferred embodiments are described supra in terms of a static positional relationship between the excitation laser(s) and the signal waveguide, in other preferred embodiments there is a dynamic positional relationship such that the amount of evanescent coupling is dynamically tunable. In still other preferred embodiments, the positional relationship between the excitation laser(s) and the signal waveguide remains the same, while other parameters are adjusted or other mechanisms are employed to make the amount of evanescent coupling between the excitation laser(s) and the signal waveguide dynamically tunable.

As still another example, while evanescent coupling in the preferred embodiments supra was described in terms of a signal waveguide that was vertically separated from a laser waveguide by one or more material layers in an integrated wafer structure, in other preferred embodiments the evanescent coupling may be achieved by horizontal separation of the signal waveguide from the laser waveguide within the same set of one or more material layers. Indeed, a variety of different barrier types between the signal waveguide and laser waveguide may be used in accordance with the preferred embodiments. Because gain-clamped amplification greatly facilitates the use of multilevel or n-ary data encoding schemes (n>2), within the scope of the preferred embodiments is a multilevel data communications system comprising at least one gain-clamped SOA in which signal amplification energy is provided by a nearby lasing field such as a transverse lasing field. As stated previously, each of these enhancements may be implemented in conjunction with the preferred embodiments of Ser. No. 09/972,146, supra, in which the gain medium of the laser cavities is coextensive with the signal waveguide. Therefore, reference to the details of the preferred embodiments is not intended to limit their scope.

What is claimed is:

1. A semiconductor optical amplifier formed from a vertical arrangement of substantially parallel material layers, the semiconductor optical amplifier amplifying an optical signal while confining it to an optical signal path substantially parallel to the material layers, the semiconductor optical amplifier comprising:
   a signal waveguide including a signal guiding layer, said signal waveguide vertically confining the optical signal around said signal guiding layer, said signal waveguide extending from an input facet to an output facet and defining said optical signal path therebetween; and
   a laser cavity including an active layer, said laser cavity being disposed between two end mirrors and defining a lasing path therebetween, said lasing path and said optical signal path vertically coinciding at an evanescent coupling region, said active layer and said signal guiding layer being vertically separated in said evanescent coupling region by at least one intervening layer;
   wherein said vertical separation between said active layer and said signal guiding layer in said evanescent coupling region is sufficiently small for an optical signal propagating along said signal guiding layer to be amplified by an evanescent coupling effect with said active layer.

2. A semiconductor optical amplifier, comprising:
   a signal waveguide including a signal guiding layer, said signal waveguide defining an optical signal path between an input and an output; and
   a laser cavity including an active layer, said laser cavity being disposed between two end mirrors and defining a lasing path therebetween, said lasing path and said optical signal path vertically coinciding at an evanescent coupling region, said active layer and said signal guiding layer being vertically separated in said evanescent coupling region by at least one intervening layer;
   wherein said vertical separation between said active layer and said signal guiding layer in said evanescent coupling region is sufficiently small for an optical signal propagating along said signal guiding layer to be amplified by an evanescent coupling effect with said active layer;
   and wherein said end mirrors each have a reflectivity of not less than 10%, said end mirrors facilitating lasing action in said laser cavity when pumped with an excitation current greater than a threshold current, said lasing action facilitating gain-clamped amplification of the optical signal.

3. The semiconductor optical amplifier of claim 2, said lasing path being transverse to said optical signal path in said evanescent coupling region.

4. A semiconductor optical amplifier (SOA) formed from a vertical arrangement of substantially parallel material layers extending in a longitudinal direction from a first edge to a second edge thereof, the SOA vertically and horizontally confining an optical signal along an optical signal path between the first edge and the second edge, the SOA comprising:
   an input facet disposed along said first edge;
   an output facet disposed along said second edge;
   a signal waveguide extending from said input facet to said output facet along said optical signal path, said signal waveguide comprising:
      a signal guiding layer comprising a passive waveguiding material;
      two cladding layers disposed vertically above and below said signal guiding layer, respectively, for vertically confining the optical signal around said signal guiding layer; and
      a horizontal confinement structure for horizontally confining the optical signal along the optical signal path; and
   a laser cavity including an active layer vertically separated from the signal guiding layer by a first distance across at least one intervening layer, said first distance being small enough for an optical signal propagating along said signal guiding layer to be amplified by an evanescent coupling effect with said active layer of said laser cavity.

5. The SOA of claim 4, said first and second edges being substantially parallel, said lasing path being substantially perpendicular to said optical signal path in said evanescent coupling region, said end mirrors being positioned on third and fourth edges of the SOA substantially perpendicular to said first and second edges, said laser cavity following a substantially straight path from one end mirror through the evanescent coupling region to the other end mirror.

6. An integrated semiconductor optical amplifier (SOA) array formed from a vertical arrangement of substantially parallel material layers, the SOA guiding an optical signal along an optical signal path while amplifying the optical signal therealong, the SOA comprising:
   a plurality of signal waveguides, each signal waveguide extending between an input facet and an output facet and defining an optical signal path therebetween; and
   a plurality of ballast lasers, each ballast laser being disposed between two end mirrors and defining a lasing path therebetween, each lasing path vertically coinciding with each of said optical signal paths at a distinct signal amplification region, each of said ballast lasers being integrated with said plurality of signal waveguides into the vertical arrangement of substantially parallel material layers such that said optical signals are amplified in each signal amplification region using energy provided by each respective ballast laser.

7. The SOA array of claim 6, each signal waveguide including a signal guiding layer, said signal guiding layers comprising passive waveguiding materials, each of said ballast lasers including an active layer vertically separated from said signal guiding layer in its respective signal amplification region by at least one intervening layer, said vertical separation being sufficiently small for an optical signal propagating along said signal guiding layer to be amplified in said signal amplification region by an evanescent coupling effect with said active layer.

8. The SOA of claim 6, each signal waveguide including a signal guiding layer, said signal guiding layer comprising a gain medium, each of said ballast lasers including an active layer coextensive with said gain media of said signal guiding layers in said signal amplification regions, said optical signals being amplified in said signal amplification regions by operation of a population inversion established in said gain media by said ballast lasers.

9. The SOA array of claim 6, wherein at least two of said ballast lasers have different operating wavelengths.

10. The SOA array of claim 6, wherein said signal waveguides do not intersect each other.

11. The SOA array of claim 6, wherein said ballast lasers do not intersect each other.

12. The SOA array of claim 6, further comprising a separately adjustable attenuation region for each signal waveguide comprising an adjustably lossy optical material, each optical signal experiencing a similar cumulative gain "G" from the ballast lasers, each optical signal having an adjustable overall gain equal to "G" minus its individually adjustable attenuation.

13. The SOA array of claim 6, wherein said ballast lasers are substantially identical to each other.

14. The SOA array of claim 6, wherein said ballast lasers each comprise multiple electrically isolated segments that receive separate bias currents, the gain for each ballast laser being separately and dynamically adjustable through separate and dynamic manipulation of said bias currents.

15. The SOA array of claim 6, wherein the lasing path of each ballast lasers is substantially perpendicular the optical signal path of each signal waveguide in said signal amplification regions.

* * * * *